United States Patent
Brockman et al.

(10) Patent No.: US 11,380,838 B2
(45) Date of Patent: Jul. 5, 2022

(54) MAGNETIC MEMORY DEVICES WITH LAYERED ELECTRODES AND METHODS OF FABRICATION

(71) Applicant: Intel Corporation, Santa Clara, CA (US)

(72) Inventors: Justin Brockman, Portland, OR (US); Conor Puls, Portland, OR (US); Stephen Wu, Portland, OR (US); Christopher Wiegand, Portland, OR (US); Tofizur Rahman, Portland, OR (US); Daniel Ouellette, Portland, OR (US); Angeline Smith, Hillsboro, OR (US); Andrew Smith, Hillsboro, OR (US); Pedro Quintero, Beaverton, OR (US); Juan Alzate-Vinasco, Tigard, OR (US); Oleg Golonzka, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 860 days.

(21) Appl. No.: 16/024,522

(22) Filed: Jun. 29, 2018

(65) Prior Publication Data
US 2020/0006634 A1    Jan. 2, 2020

(51) Int. Cl.
*H01L 43/02* (2006.01)
*G11C 11/16* (2006.01)
*H01L 21/768* (2006.01)
*H01L 23/528* (2006.01)
*H01L 27/22* (2006.01)
(Continued)

(52) U.S. Cl.
CPC ............ *H01L 43/02* (2013.01); *G11C 11/161* (2013.01); *H01L 21/76831* (2013.01); *H01L 21/76832* (2013.01); *H01L 23/528* (2013.01); *H01L 27/228* (2013.01); *H01L 43/08* (2013.01); *H01L 43/10* (2013.01); *H01L 43/12* (2013.01)

(58) Field of Classification Search
CPC ..................... H01L 43/08; H01L 27/22–228
See application file for complete search history.

(56) References Cited

U.S. PATENT DOCUMENTS 10,043,967 B2    8/2018    Chen et al.
2011/0156181 A1*    6/2011    Takeuchi ................ H01L 43/12
257/421

(Continued)

FOREIGN PATENT DOCUMENTS

WO    2016022210    2/2016
WO    2017171747    10/2017

OTHER PUBLICATIONS

Extended European Search Report from European Patent Application No. 19176627.8 dated Dec. 10, 2019, 8 pgs.

*Primary Examiner* — Scott B Geyer
(74) *Attorney, Agent, or Firm* — Essential Patents Group, LLP

(57) ABSTRACT

A memory device method of fabrication that includes a first electrode having a first conductive layer including titanium and nitrogen and a second conductive layer on the first conductive layer that includes tantalum and nitrogen. The memory device further includes a magnetic tunnel junction (MTJ) on the first electrode. In some embodiments, at least a portion of the first conductive layer proximal to an interface with the second conductive layer includes oxygen.

22 Claims, 14 Drawing Sheets

(51) Int. Cl.
  *H01L 43/08*  (2006.01)
  *H01L 43/10*  (2006.01)
  *H01L 43/12*  (2006.01)

(56) References Cited

U.S. PATENT DOCUMENTS

| | | |
|---|---|---|
| 2013/0034917 A1 | 2/2013 | Lee |
| 2014/0269036 A1 | 9/2014 | Pi et al. |
| 2015/0069480 A1* | 3/2015 | Kanaya .................. G11C 7/18 |
| | | 257/295 |
| 2015/0171316 A1 | 6/2015 | Park et al. |
| 2015/0303372 A1* | 10/2015 | Meade .................. H01L 43/02 |
| | | 257/421 |
| 2016/0276580 A1 | 9/2016 | Tahmasebi et al. |
| 2016/0351799 A1 | 12/2016 | Xue et al. |
| 2017/0069683 A1* | 3/2017 | Sugiura .................. H01L 43/12 |
| 2017/0076769 A1 | 3/2017 | Shirotori et al. |
| 2017/0125078 A1 | 5/2017 | Mihajlovic et al. |
| 2017/0178705 A1 | 6/2017 | Buhrman et al. |
| 2018/0114898 A1 | 4/2018 | Lee |
| 2018/0158728 A1* | 6/2018 | Chu ........................ H01L 43/02 |
| 2018/0226452 A1* | 8/2018 | Nam .................... H01L 27/228 |
| 2018/0358070 A1* | 12/2018 | Song ...................... H01L 43/02 |
| 2018/0358547 A1* | 12/2018 | Yang ..................... H01L 27/224 |
| 2019/0027679 A1 | 1/2019 | Ouellette et al. |
| 2019/0165256 A1* | 5/2019 | Tien .................... H01L 23/5226 |
| 2019/0189906 A1* | 6/2019 | Lee ........................ H01L 43/10 |
| 2020/0006431 A1* | 1/2020 | Mayuzumi .......... H01L 27/2481 |
| 2020/0006626 A1* | 1/2020 | Smith .................... H01L 43/02 |
| 2020/0273864 A1 | 8/2020 | Manipatruni et al. |
| 2020/0273866 A1 | 8/2020 | Manipatruni et al. |
| 2020/0273867 A1 | 8/2020 | Manipatruni et al. |
| 2020/0303343 A1 | 9/2020 | Manipatruni et al. |
| 2020/0303344 A1 | 9/2020 | Manipatruni et al. |
| 2020/0321344 A1 | 10/2020 | Ramamoorthy et al. |
| 2020/0321472 A1 | 10/2020 | Ramamoorthy et al. |
| 2020/0321473 A1 | 10/2020 | Ramamoorthy et al. |
| 2020/0321474 A1 | 10/2020 | Ramamoorthy et al. |
| 2021/0202507 A1 | 7/2021 | Thareja et al. |
| 2021/0202510 A1 | 7/2021 | Thareja et al. |
| 2021/0202689 A1 | 7/2021 | Thareja et al. |
| 2021/0202690 A1 | 7/2021 | Thareja et al. |
| 2021/0203324 A1 | 7/2021 | Manipatruni et al. |
| 2021/0203325 A1 | 7/2021 | Manipatruni et al. |
| 2021/0203326 A1 | 7/2021 | Manipatruni et al. |
| 2021/0226636 A1 | 7/2021 | Manipatruni et al. |

* cited by examiner

MAGNETIC MEMORY DEVICES WITH LAYERED ELECTRODES AND METHODS OF FABRICATION

BACKGROUND

For the past several decades, feature size reduction has been an important focus for industrial-scale semiconductor process development. Scaling to smaller dimensions enables a higher density of functional elements per chip, smaller chips, and also reduced cost. However, as the industry approaches the physical limits of traditional scaling, it is becoming increasingly important to look for non-traditional types of devices that can offer new functionality. One such example is perpendicular magnetic random-access memory (MRAM) devices based on magnetic tunnel junctions (MTJ).

Embedded perpendicular MRAM can offer improved energy and computational efficiency, as well as memory non-volatility. However, it is a formidable technical challenge to assemble a high-yielding MRAM array that is fully integrated with the surrounding logic circuitry.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DESCRIPTION OF THE EMBODIMENTS

Figure 1A:
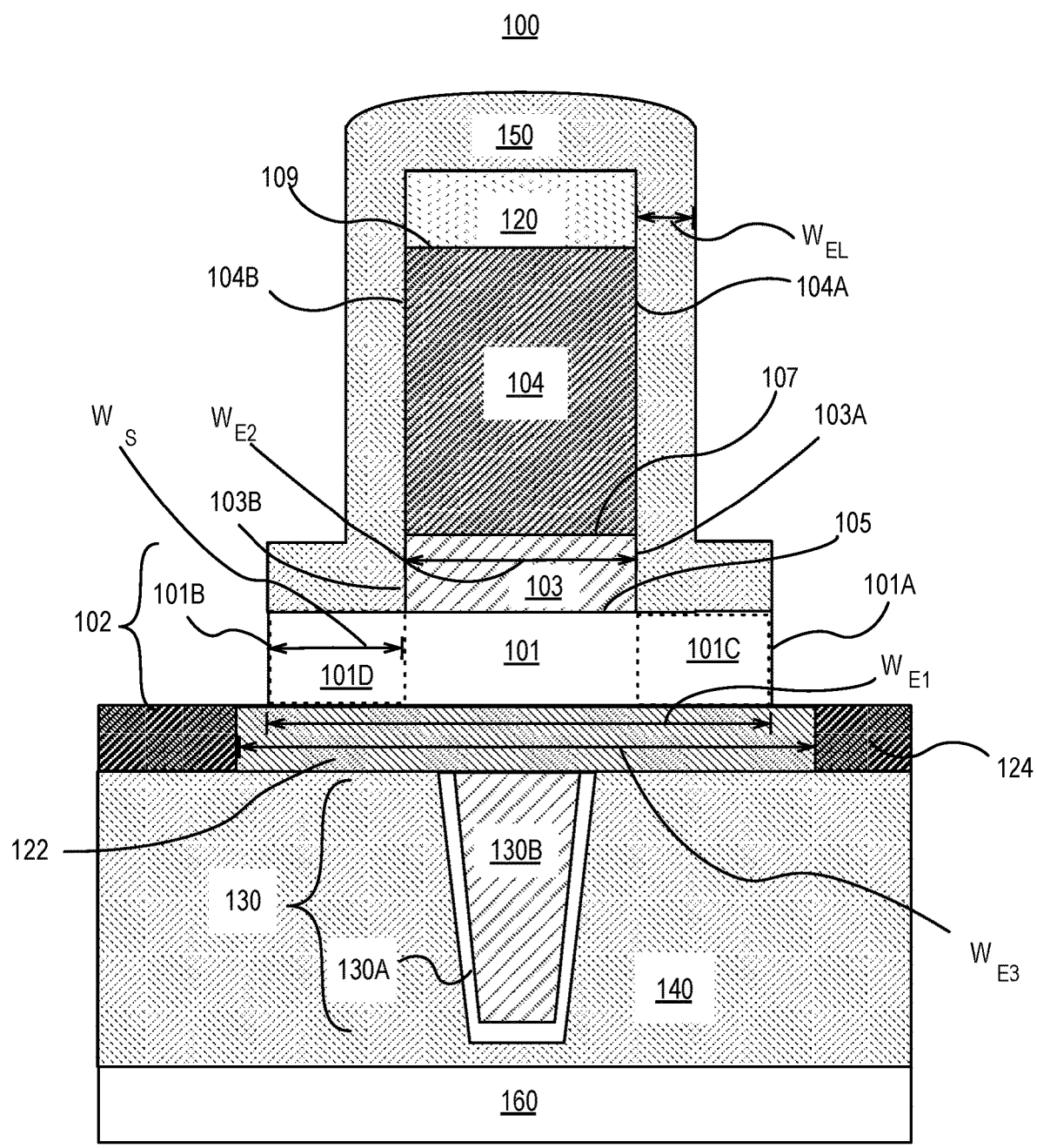
FIG. 1A illustrates a cross-sectional view of a memory device, in accordance with an embodiment of the present disclosure.

Magnetic tunnel junction (MTJ) based memory devices with layered electrodes and their methods of fabrication are described. The disclosure described herein presents a new solution to the specific challenge of integrating magnetic random-access memory (MRAM) arrays including magnetic tunnel junctions into the surrounding logic circuitry through the use of a layered bottom electrode contact structure that promotes desirable device yield and performance characteristics, while still allowing clean removal of the layered bottom electrode contact structure from selected regions of a semiconductor wafer. In the following description, numerous specific details are set forth, such as novel structural schemes and detailed fabrication methods, in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

An MTJ device functions as a memory device where the resistance of the MTJ device switches between a high resistance state and a low resistance state. The resistance state of an MTJ device is defined by the relative orientation of magnetization between a free magnet and a fixed magnet that are separated by a tunnel barrier. When the magnetization of the free magnet and a fixed magnet have orientations that are in the same direction, the MTJ device is said to be in a low resistance state. Conversely, when the magnetization of the free magnet and a fixed magnet each have orientations that are in opposite direction to each other, the MTJ device is said to be in a high resistance state.

As MTJ devices are scaled, the need for smaller memory elements to fit into a scaled cell size has driven the industry in the direction of perpendicular MTJ (pMTJ). pMTJ based memory devices have a fixed magnet and a free magnet each having a magnetic anisotropy that is perpendicular with respect to a plane of the free magnet. Resistance switching is brought about in a pMTJ device by passing a critical amount of spin polarized current through the pMTJ device so as to influence the orientation of the magnetization of the free magnet to align with the magnetization of the fixed magnet. The act of influencing the magnetization is brought about by a phenomenon known as spin torque transfer, where the torque from the spin polarized current is imparted to the magnetization of the free magnet. By changing the direction of the current, the direction of magnetization in the free magnet may be reversed relative to the direction of magnetization in the fixed magnet. Since the free magnet does not need a constant source of spin polarized current to maintain a magnetization direction, the resistance state of the pMTJ device is retained even when there is no current flowing through the pMTJ device. For this reason, the MTJ device belongs to a class of memory known as non-volatile memory.

The embodiments of the present disclosure describe a layered bottom electrode contact structure and method of fabrication which simultaneously solves several technological challenges necessary for the fabrication of pMTJ device arrays. One such challenge is to select a bottom electrode contact structure and method of fabrication that can promote deposition of a fixed magnet with strong FCC<111> crystal structure and a strong perpendicular magnetic anisotropy. This is desirable for achieving a high tunneling magnetoresistance ratio (TMR) in pMTJ devices in the array, and for efficiently electrically switching pMTJ devices with a low switching voltage and with a low write error rate (WER).

Another challenge is to choose a bottom electrode contact structure and method of fabrication that reduces the amount of conducting residue material on the side of the pMTJ devices. This is necessary to minimize device sidewall shorting and achieve a high pMTJ device array yield. Another challenge is to choose a bottom electrode contact structure and method of fabrication that allows for the clean and damage-free removal of the bottom electrode contact structure from non-memory regions of a wafer where it is not desired and from memory regions to isolate pMTJ devices. Damage free removal of bottom electrode contact structure is desirable to maintain a high yield for the existing logic circuitry into which the pMTJ device arrays are being inserted.

In embodiments of the present disclosure, a memory device includes a layered first electrode structure having a first conductive layer that includes titanium and nitrogen and a second conductive layer on the first conductive layer that includes tantalum and nitrogen. The first layer of titanium and nitrogen is a conductive material that is easy to remove from the substrate by a suitable etch process, and the first layer is also a suitable material to utilize as an etch stop during formation of pMTJ devices. The second layer of tantalum and nitrogen is a thin layer that is superior over the first layer for promoting subsequent deposition of pMTJ fixed layers with strong FCC <111> crystal texture and strong perpendicular magnetic anisotropy. For practical reasons, the second layer may have a thickness that is substantially less than the thickness of the first layer. Such a consideration allows for the pMTJ device etch to endpoint upon completion of etch of the first layer. The first layer is selected to be more advantageous for reducing device sidewall shorting and for ease of removal from the non-memory regions of the wafer, whereas the second layer is more favorable for promoting strong FCC <111> crystal structure and strong perpendicular anisotropy. For practical reasons, the first layer may have a thickness which is relatively thick to ensure that the pMTJ device etch does not penetrate through it. This consideration allows that the pMTJ device etch can be protected against penetrating through the first layer and damaging underlying CMOS interconnect layers and circuitry on the wafer in non-memory regions.

The memory device further includes a perpendicular magnetic tunnel junction (pMTJ) on the first electrode, where the pMTJ includes a fixed magnet, a free magnet and a tunnel barrier between the free magnet and the fixed magnet and a second electrode on the pMTJ. In one embodiment, the first layer can have a cubic crystal structure with a columnar grain structure and crystalline texture. However, a second conductive layer including an amorphous material may mask the undesired crystal texture of the underlying first conductive layer and present a surface more compatible for growth of bottom-most layers of the pMTJ stack to have a FCC <111> crystal texture and a strong perpendicular magnetic anisotropy. In an embodiment, at least a portion of the first conductive layer proximal to an interface with the second conductive layer further includes oxygen. Presence of oxygen may arise due to the nature of the fabrication scheme as will be described below.

FIG. 1A illustrates a cross-sectional illustration of a memory device 100 in accordance with an embodiment of the present disclosure. The memory device 100 includes a bottom electrode 102 having a first conductive layer 101 that includes titanium and nitrogen, and a second conductive layer 103 that includes tantalum and nitrogen on top of the conductive layer 101. The memory device 100 further includes a magnetic tunnel junction (MTJ) 104 on the bottom electrode 102. In an embodiment, the MTJ 104, includes a free magnet 108, a tunnel barrier 110, and a fixed magnet 112, as is depicted in generalized form in FIG. 1B and FIG. 1C. The memory device 100 further includes a second electrode such as a top electrode 120 on the MTJ 104.

In an embodiment, the conductive layer 101 includes a material such as TiN, where the TiN has a multi-orientation cubic crystal lattice texture and a columnar grain structure. In one embodiment the TiN has a <001> texture. In other examples, a wide variety of phases in each of the columnar grains in the TiN such as <110>, <111> or <221> are also possible.

In the illustrative embodiment, a plurality of columnar grain structures in the conductive layer 101 have a substantially co-planar uppermost surface.

In some examples, at least a portion of the conductive layer 101 proximal to an interface 105 with the second conductive layer 103 includes oxygen. Depending on embodiments, the oxygen may extend continuously across a width, $W_{E1}$, of the conductive layer 101. In one embodiment, some portions of the conductive layer 101 are directly adjacent the conductive layer 103 with no oxygen in between.

In an embodiment, the conductive layer 103 includes a material such as tantalum nitride, which is favorable for promoting high-quality FCC<111> crystal structure and strong magnetic perpendicular anisotropy of the subsequent magnetic fixed layers in the pMTJ stack. In some examples, at least a portion of the conductive layer 103 proximal to an interface 107 with a lowermost layer of the MTJ 104 includes oxygen. Depending on embodiments, the oxygen may extend continuously across a width, $W_{E2}$, of the conductive layer 101. In one embodiment, some portions of the conductive layer 103 are directly adjacent to the lowermost layer of the MTJ 104, with no oxygen in between. In embodiments, the amount of oxygen in a portion of the conductive layer 103 proximal to an interface 107 with a lowermost layer of the MTJ 104 is substantially smaller compared to the amount of oxygen in the portion of the conductive layer 101 proximal to an interface with the second conductive layer 103. Such differences may arise from the nature of fabrication of the electrode as will be discussed further below.

In an embodiment, the conductive layer 101 has a thickness that is greater than the thickness of the conductive layer 101. The conductive layer 101 has a thickness between 10 nm and 30 nm and the conductive layer 103 has a thickness between 1 nm and 5 nm. A thickness between 1 nm and 5 nm is sufficiently thick to mask a cubic <001> crystal texture of an underlying material. In an embodiment, when the conductive layer 103 includes a material such as TaN, conductive layer 101 also functions as an etch stop layer.

In the illustrative embodiment, the conductive layer 101 has a first sidewall 101A and an opposing second sidewall 101B that is separated by the first width $W_{E1}$ and the conductive layer 103 has a first sidewall 103A and an opposing sidewall 103B that is separated by the width $W_{E2}$. As shown, $W_{E2}$ is less than $W_{E1}$, and the sidewall 101A extends laterally beyond the sidewall 103A and the sidewall 101B extends laterally beyond the sidewall 103B. As illustrated, the sidewalls 101A and, 101B extend laterally beyond the sidewalls 103A and 103B, respectively by a width, $W_S$. In some embodiments, the width, $W_S$ ranges between 20 nm-50 nm.

As shown, the conductive layer 103 is on a first portion of the conductive layer 101 and the memory device 100 further includes an encapsulation layer 150 on a second and on a third portion 101C and 101D, respectively, of the first conductive layer 101. The encapsulation layer 150 has a thickness, $W_{EL}$, between 10 nm and 30 nm. In the illustrative embodiment, the encapsulation layer 150 has a lowermost portion on conductive layer portion 101C and on conductive layer portion 101D. The lowermost portion of the encapsulation layer 150 has a width $W_S$. $W_S$ may be either equal to $W_{EL}$ or greater than $W_{EL}$.

The encapsulation layer 150 is also adjacent to the sidewalls 103A and 103B, adjacent to sidewalls 104A, 104B of the MTJ 104 and adjacent to sidewalls of the top electrode 120. As illustrated, a portion of the encapsulation layer 150 is on the top electrode 120 and over an interface 109 between the second electrode 120 and the MTJ 104.

The memory device 100, is on a conductive cap 122 below the conductive layer 101. The conductive cap 122 has a width, $W_{E3}$. The width, $W_{E3}$ may be greater than or less than the width $W_{E1}$, of the conductive layer 101. In some embodiments, the conductive cap 122 has a width $W_{E3}$ that is designed to be greater than the width $WE_1$ to protect a conductive interconnect 130 below. The conductive cap 122 is adjacent to an etch stop layer 124. In an embodiment, the conductive cap 122 includes a material such as tantalum, tantalum nitride, tungsten, titanium nitride or titanium. The conductive cap 122. The etch stop layer 124 may include a dielectric material such as silicon nitride, silicon carbide or carbon doped silicon nitride.

Figure 1B:
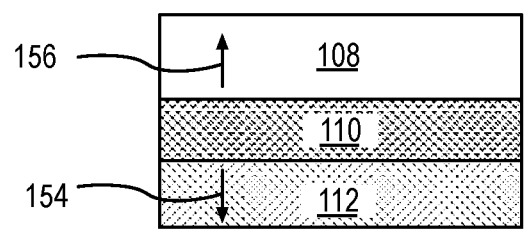
FIG. 1B illustrates a cross-sectional view depicting a direction of magnetization in a free magnet that is anti-parallel to a direction of magnetization in a fixed magnet, in accordance with an embodiment of the present disclosure.

FIG. 1B illustrates a cross-sectional view depicting the free magnet 108 of the MTJ 104 having a direction of magnetization (denoted by the direction of the arrow 156) that is anti-parallel to a direction of magnetization (denoted by the direction of the arrow 154) in the fixed magnet 112. When the direction of magnetization 156 in the free magnet 108 is opposite (anti-parallel) to the direction of magnetization 154 in the fixed magnet 112, the MTJ 104 is said to be in a high resistance state.

Figure 1C:
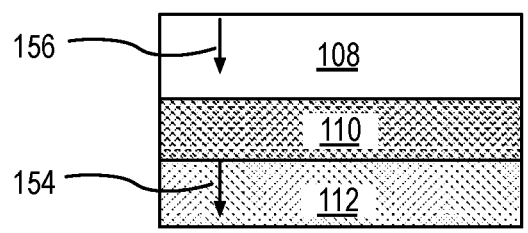
FIG. 1C illustrates a cross-sectional view depicting a direction of magnetization in a free magnet that is parallel to a direction of magnetization in a fixed magnet, in accordance with an embodiment of the present disclosure.

Conversely, FIG. 1C illustrates a cross-sectional view depicting the free magnet 108 of the MTJ 104 having a direction of magnetization (denoted by the direction of the arrow 156) that is parallel to a direction of magnetization (denoted by the direction of the arrow 154) in the fixed magnet 112. When the direction of magnetization 156 in the free magnet 108 is parallel to the direction of magnetization 154 in the fixed magnet 112, the MTJ 104 is said to be in a low resistance state.

In an embodiment, the free magnet 108 includes a magnetic material such as Co, Ni, Fe or alloys of these materials. In an embodiment, the free magnet 108 includes a magnetic material such as CoB, FeB, CoFe and CoFeB. In an embodiment, the free magnet 108 of the MTJ 104 includes alloys such as CoFe, CoFeB, FeB, doped with tungsten, tantalum, or molybdenum to promote high perpendicular anisotropy. In an embodiment, the free magnet 108 of the MTJ 104 includes alloys such as CoFe, CoFeB, FeB, having one or more layers of tungsten, tantalum, or molybdenum to promote high perpendicular anisotropy. In an embodiment, the free magnet 108 has a thickness between 0.9 nm-3.0 nm for MTJ devices.

In an embodiment, tunnel barrier 110 is composed of a material suitable for allowing electron current having a majority spin to pass through tunnel barrier 110, while impeding, at least to some extent, electron current having a minority spin from passing through tunnel barrier 110. Thus, tunnel barrier 110 (or spin filter layer) may also be referred to as a tunneling layer for electron current of a particular spin orientation. In an embodiment, tunnel barrier 110 includes a material such as, but not limited to, magnesium oxide (MgO) or aluminum oxide ($Al_2O_3$). In an embodiment, tunnel barrier 110 including MgO has a crystal orientation that is (001) and is lattice matched to free magnet 108 below tunnel barrier 110 and fixed magnet above tunnel barrier 110. In an embodiment, tunnel barrier 110 is MgO and has a thickness in the range of 1 nm to 2 nm. In an embodiment, a free magnet 108 including a $C_{100-x-y}Fe_xB_y$, is highly lattice matched to the tunnel barrier 110 including an MgO. Lattice matching a crystal structure of the free magnet 108 with the tunnel barrier 110 enables a high tunneling magnetoresistance ratio (TMR) ratio in the MTJ 104.

In an embodiment, the fixed magnet 112 includes magnetic materials with sufficient perpendicular magnetization. In an embodiment, the fixed magnet 112 of the MTJ 104 includes alloys such as CoFe, CoFeB, FeB, doped with tungsten, tantalum, or molybdenum to promote high perpendicular anisotropy. In an embodiment, the free magnet 108 of the MTJ 104 includes alloys such as CoFe, CoFeB, FeB, having one or more layers of tungsten, tantalum, or molybdenum to promote high perpendicular anisotropy. In an embodiment the fixed magnet 112 has a thickness that is between 1 nm-3 nm. In further embodiments, there are additional layers of high-anisotropy Co/Pt or Co/Ni or Co/Pd multilayers and/or alloys to provide a further perpendicular anisotropy boost to the alloys such as CoFe, CoFeB, or FeB. In further embodiments, thin layers of ruthenium and iridium can be used to antiferromagnetically couple Co/Pt or Co/Ni or Co/Pd multilayers and/or alloys to form a synthetic antiferromagnetic structure that minimizes stray magnetic field impinging on the free layer 108.

It is to be appreciated that many additional layers of magnetic and non-magnetic inserts are commonly used at a variety of positions inside generalized pMTJ stack for a multitude of purposes such as blocking diffusion, enhancing film crystallinity and texture, and coupling two magnetic layers together either ferromagnetically or antiferromagnetically.

Referring again to FIG. 1A, in an embodiment, the top electrode 120 includes a material such as Ta or W or TiN. In an embodiment, the top electrode 120 has a thickness between 5 nm and 70 nm.

In an embodiment, the conductive interconnect 130 and includes a barrier layer 130A, such as tantalum or tantalum nitride and a fill metal 130B such as copper, tungsten.

In an embodiment, the substrate 160 includes a suitable semiconductor material such as but not limited to, single crystal silicon, polycrystalline silicon and silicon on insulator (SOI). In another embodiment, substrate 160 includes other semiconductor materials such as germanium, silicon germanium or a suitable group III-N or a group III-V compound. In the illustrative embodiment, the substrate 160 includes a layer of dielectric material above a semiconductor material such as but not limited to, single crystal silicon, polycrystalline silicon, silicon germanium or a suitable group III-N or a group III-V compound. Logic devices such as MOSFET transistors and access transistors and may be formed on the substrate 160. Logic devices such as access transistors may be integrated with memory devices such as SOT memory devices to form embedded memory. Embedded memory including magnetic memory devices and logic MOSFET transistors can be combined to form functional integrated circuits such as a system on chip.

Figure 2:
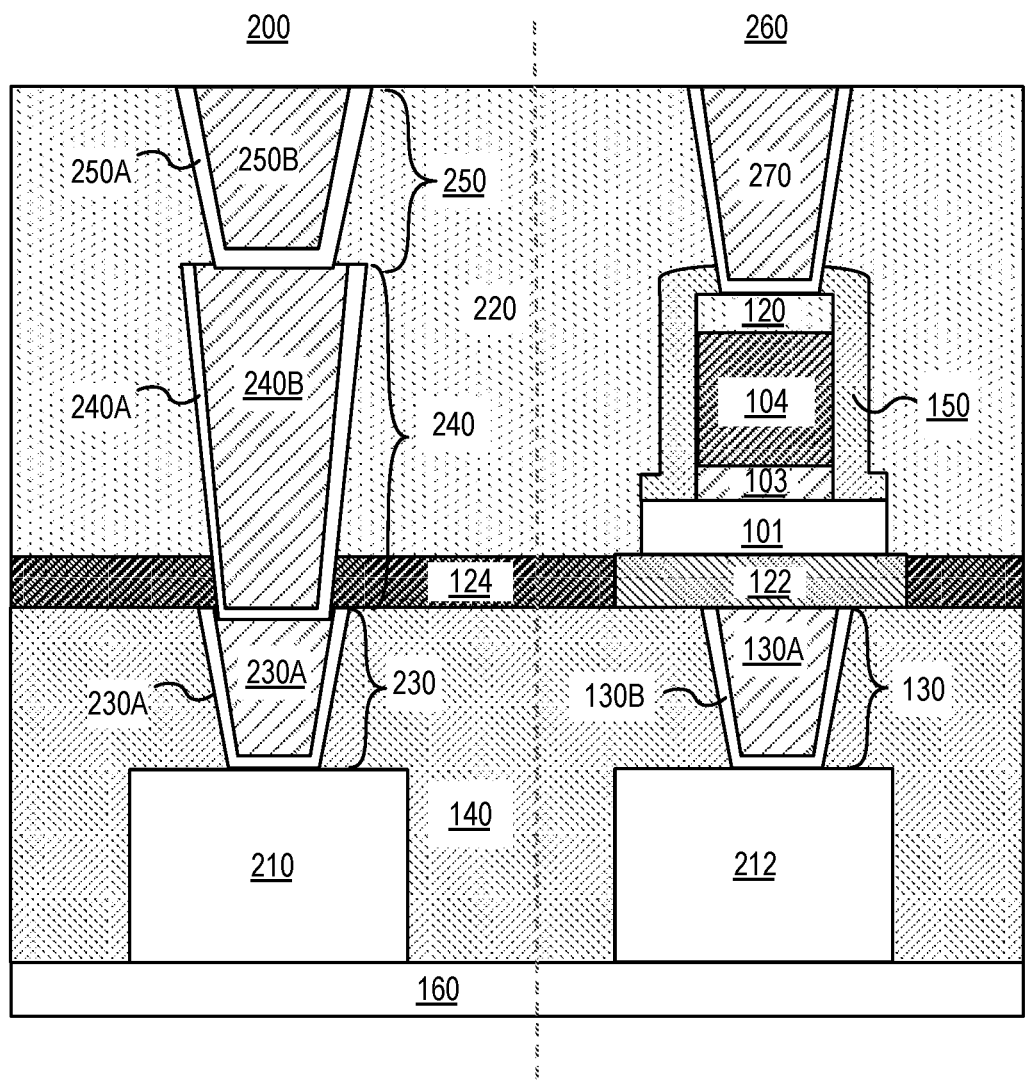
FIG. 2 illustrates a cross-sectional view of a memory device coupled with a transistor in a memory region and a logic transistor coupled with a plurality of conductive interconnects in a logic region, in accordance with an embodiment of the present disclosure.

FIG. 2 is a cross sectional illustration of an integrated circuit structure including a first region 200 and a second region 250, adjacent to the first region 200. In an embodiment, the first region 200 includes a plurality of transistors and the second region 250 includes a plurality of memory devices, where each memory device coupled with a single transistor. In the illustrative embodiment, the first region 200 includes a transistor 210, and a conductive interconnect 230 coupled with one terminal of the transistor 210. Other conductive interconnects (not shown) may be coupled with other terminals of the transistor 212. The transistor 210 and the conductive layer 230 is surrounded by a dielectric material 140. An etch stop layer 124 is above the conductive interconnect 230 and the dielectric material 140.

The second region includes the memory device 100 above the conductive interconnect 130. As shown, the conductive interconnect 130 is electrically coupled with one terminal of a transistor 212. In an embodiment, the conductive interconnect 130 is coupled with a drain terminal of the transistor 212. Other conductive interconnects (not shown) may be coupled with other remaining terminals, such as a source terminal and a gate terminal of the transistor 210. The second region further includes the etch stop layer 124 above the conductive interconnect 130 and above the dielectric material 140. The etch stop layer 124 is continuous between the first region 200 and the second region 250. In an embodiment, the dielectric material 140 is also continuous between the first region 200 and the second region 250. In one embodiment, each of conductive interconnects 230 and 130 have an uppermost portion that are coplanar or substantially coplanar. In one such embodiment, the etch stop layer 124 is on a same plane in the first and second regions 200 and 250, respectively, as shown.

A conductive cap 122 is on the second conductive interconnect 130, adjacent to the etch stop layer 124. A conductive cap, such as the conductive cap 122 may or may not be present above the conductive interconnect 230 in the first region 200.

The first region 200 further includes a conductive interconnect 240 on the conductive interconnect 230 to form an interconnect metallization structure. In some embodiments, the conductive interconnect 240 may have a height that is substantially equal to a combined height of the electrode structure 102, the MTJ 104, the top electrode 120 and the encapsulation layer 150, as shown in FIG. 2. In the illustrative embodiment, a portion of the conductive interconnect 240 is adjacent to the etch stop layer 124 above the conductive interconnect 230. The conductive interconnect 240 is surrounded by a dielectric material 220 as shown. The dielectric material 220 may extend continuously between the first and the second regions 200 and 250, respectively, as illustrated.

The first region 200 may further include another conductive interconnect 245 on the conductive interconnect 240. The memory device 100 may further include a conductive interconnect 270 coupled with the top electrode 120 through the encapsulation layer 150, as shown.

In an embodiment, the conductive interconnects 230, 240, 245 and 270 are the same as or substantially the same as the conductive interconnect 130. In an embodiment, the conductive interconnect 230 includes a barrier layer 230A and a fill metal 230B, the conductive interconnect 240 includes a barrier layer 240A and a fill metal 240B, the conductive interconnect 245 includes a barrier layer 245A and a fill metal 245B, and the conductive interconnect 270 includes a barrier layer 270A and a fill metal 270B as shown.

Figure 3A:
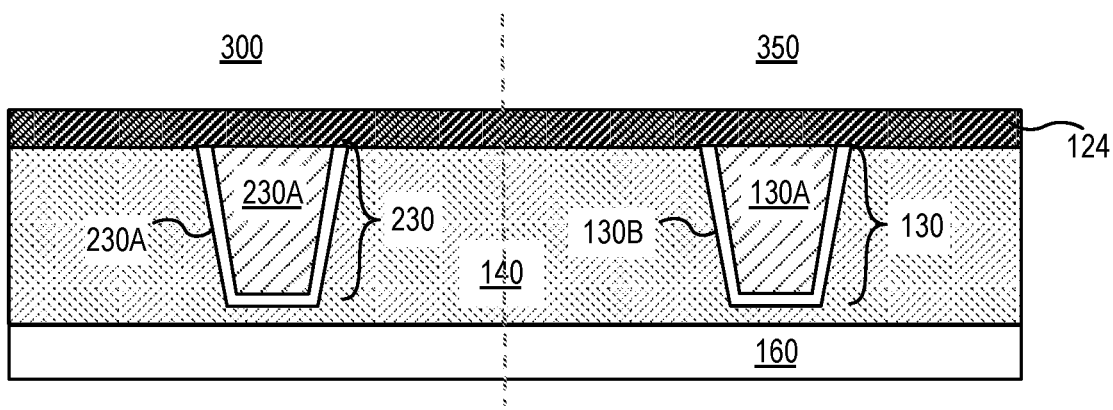
FIG. 3A illustrates a cross-sectional view of a first conductive interconnect adjacent to a dielectric layer in a memory region and a second conductive interconnect adjacent to the dielectric layer in a second region of a substrate and an etch stop layer above the first and second conductive interconnects.
Figure 3B:
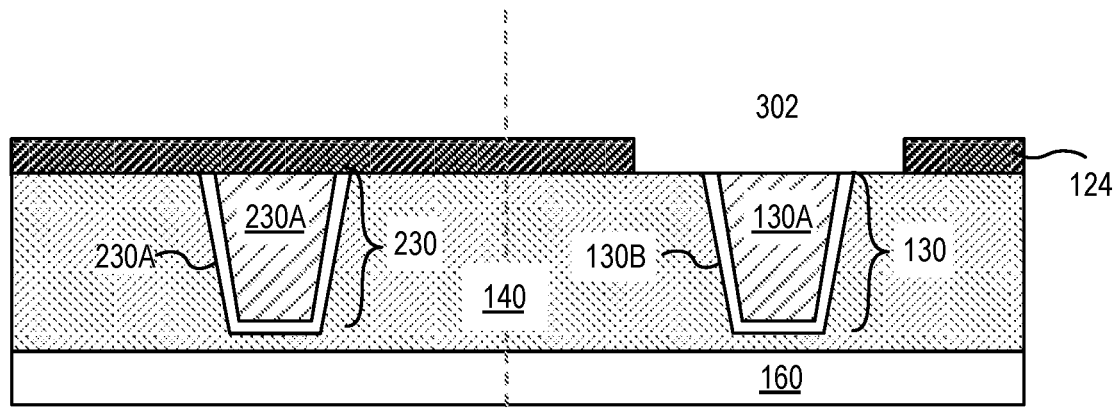
FIG. 3B illustrates a cross-sectional view of the structure in FIG. 3A following the formation of an opening in the etch stop layer over the first conductive interconnect in the memory region.
Figure 3C:
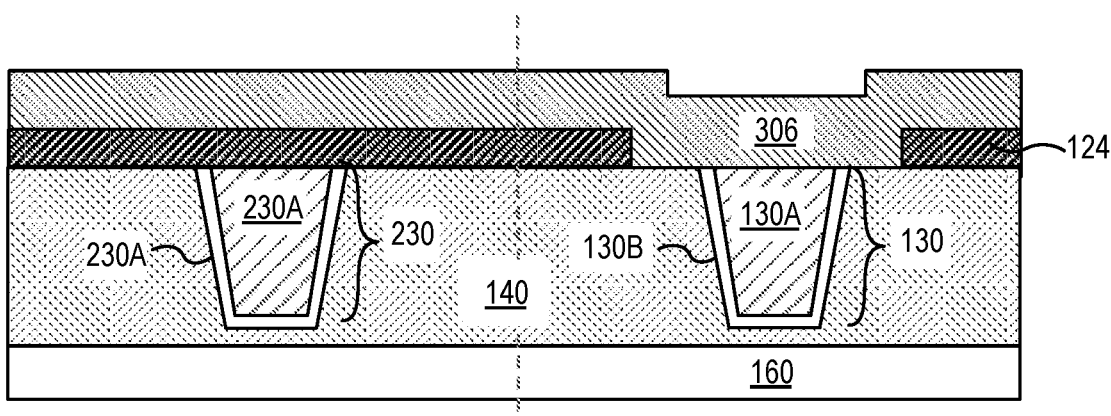
FIG. 3C illustrates a cross-sectional view of the structure in FIG. 3B following the formation of conductive capping layer in the opening above the first conductive interconnect.
Figure 3D:
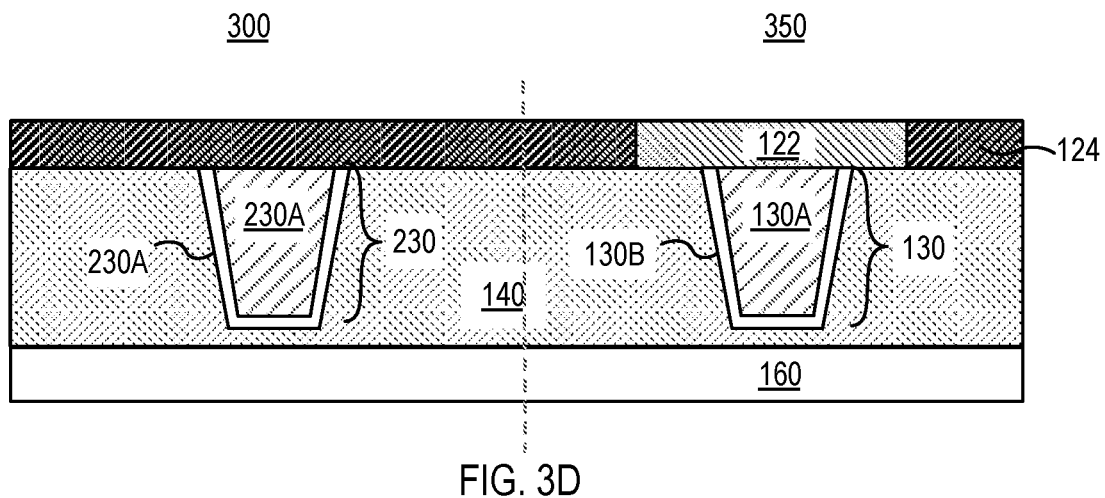
FIG. 3D illustrates the structure of FIG. 3C following the planarization of the conductive capping layer from above the etch stop layer and the formation of a conductive cap above the first conductive interconnect.
Figure 3E:
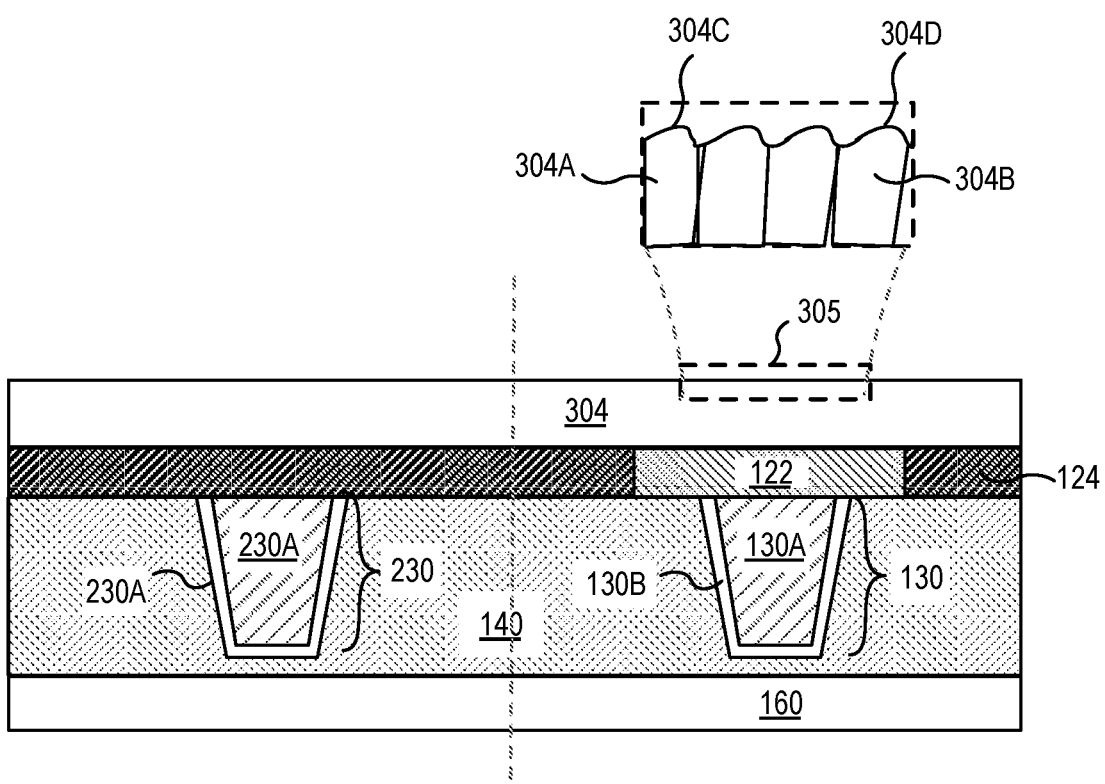
FIG. 3E illustrates the structure of FIG. 3D following the formation of a conductive layer on the conductive cap and on the etch stop layer.
Figure 3F:
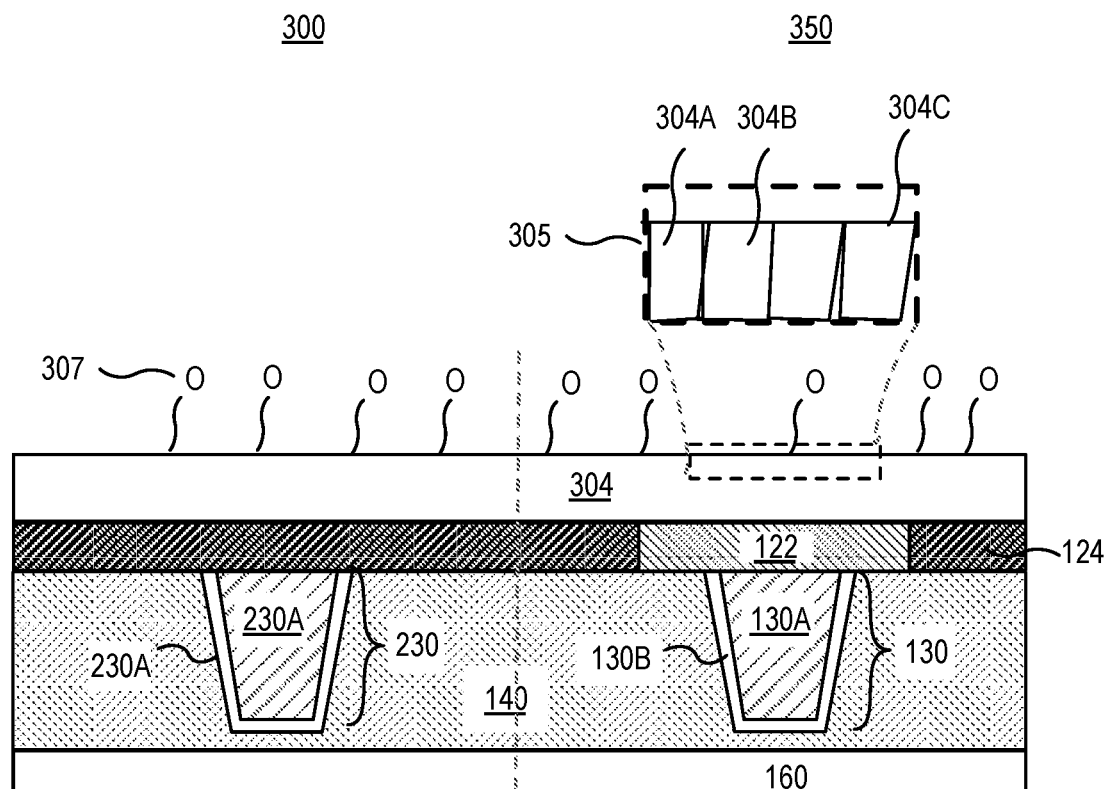
FIG. 3F illustrates the structure of FIG. 3E following the planarization of the conductive layer in the memory and in the second region.
Figure 3G:
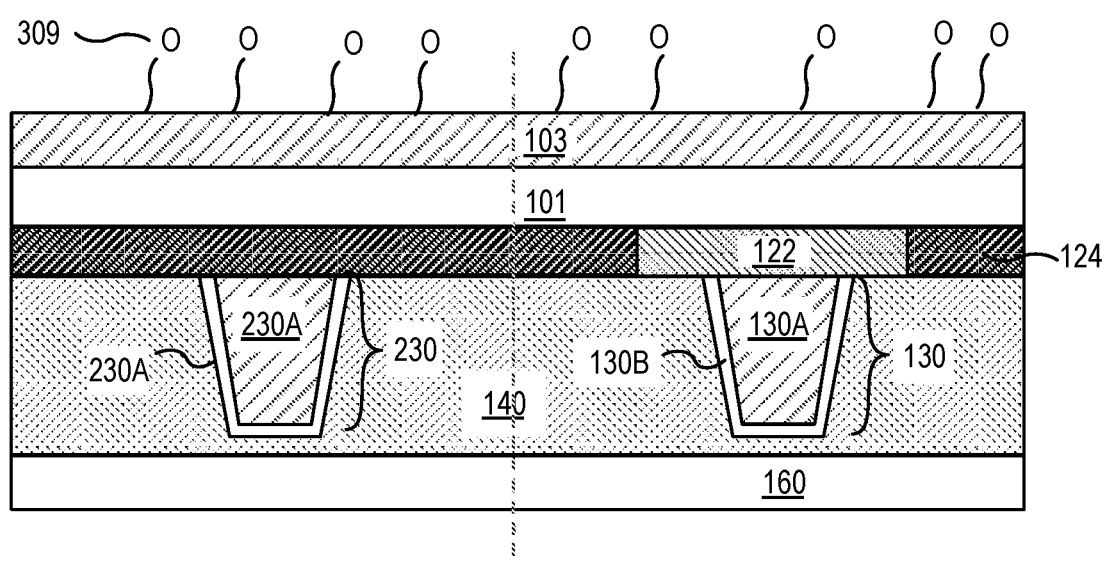
FIG. 3G illustrates the structure of FIG. 3H following the formation of a second conductive tantalum and nitrogen-containing layer on the planarized surface of the first conductive titanium and nitrogen-containing layer.
Figure 3H:
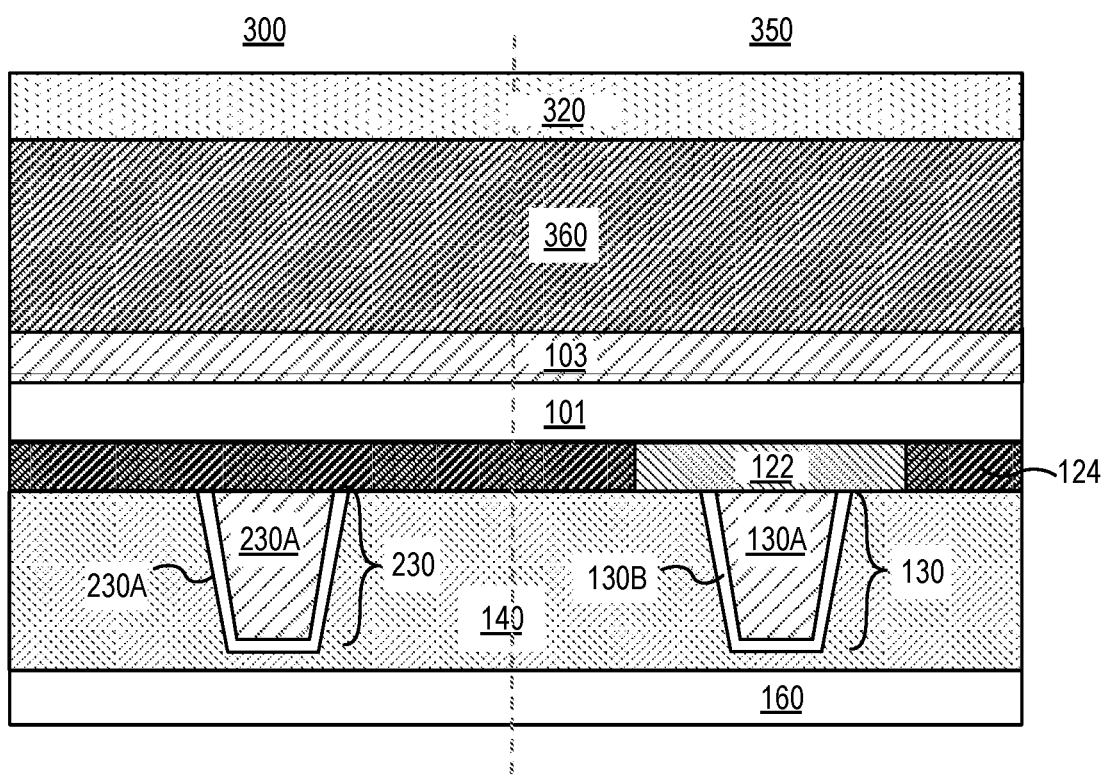
FIG. 3H illustrates the structure of FIG. 3G following the formation of a MTJ material layer stack over the substrate.
Figure 3I:
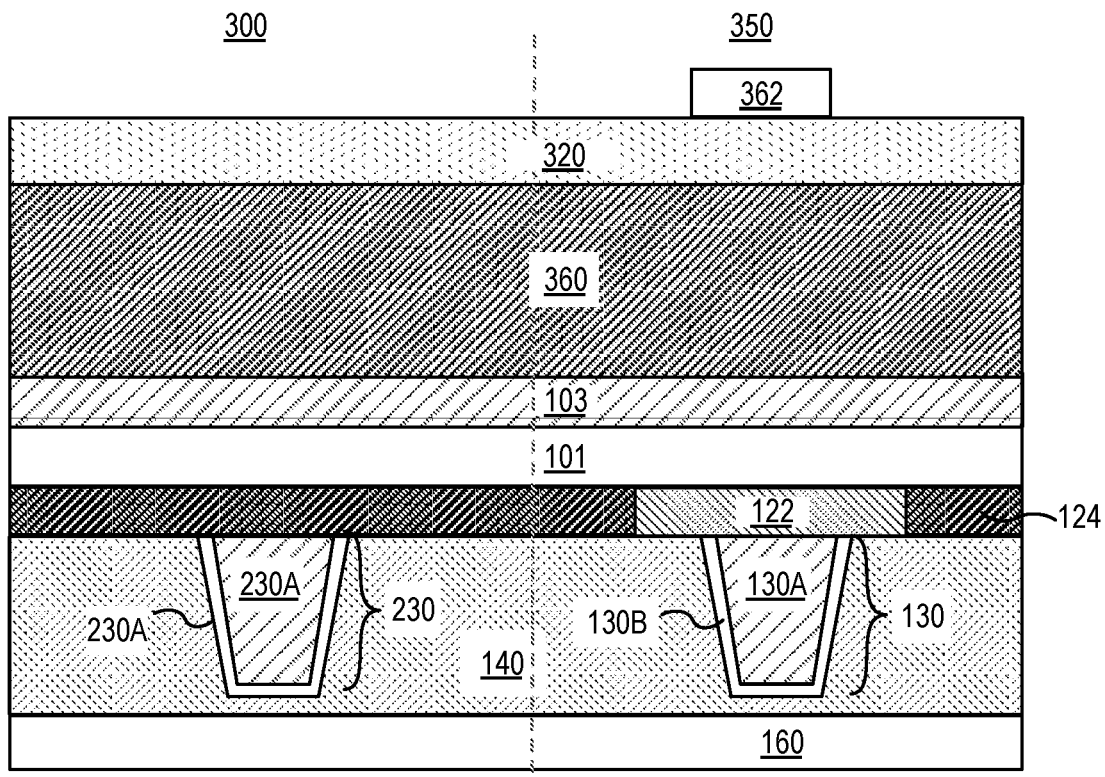
FIG. 3I illustrates the structure of FIG. 3H following the formation of a lithographic mask to define a location for a MTJ in the memory region.
Figure 3J:
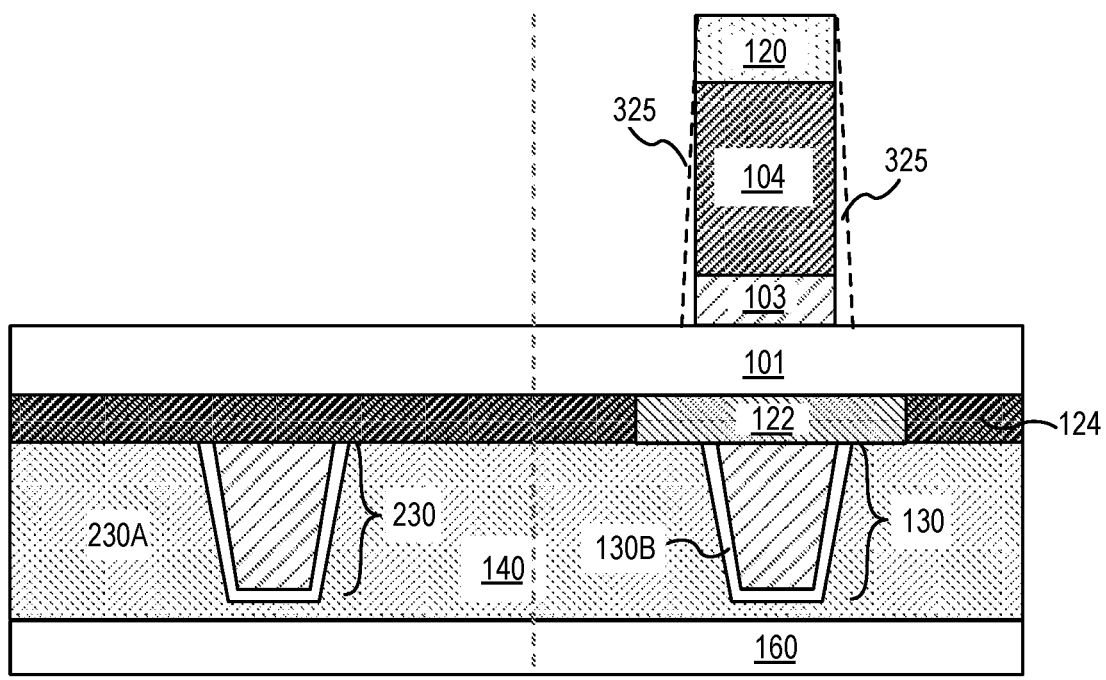
FIG. 3J illustrates the structure of FIG. 3I following the patterning and etching of the MTJ material layer stack.
Figure 3K:
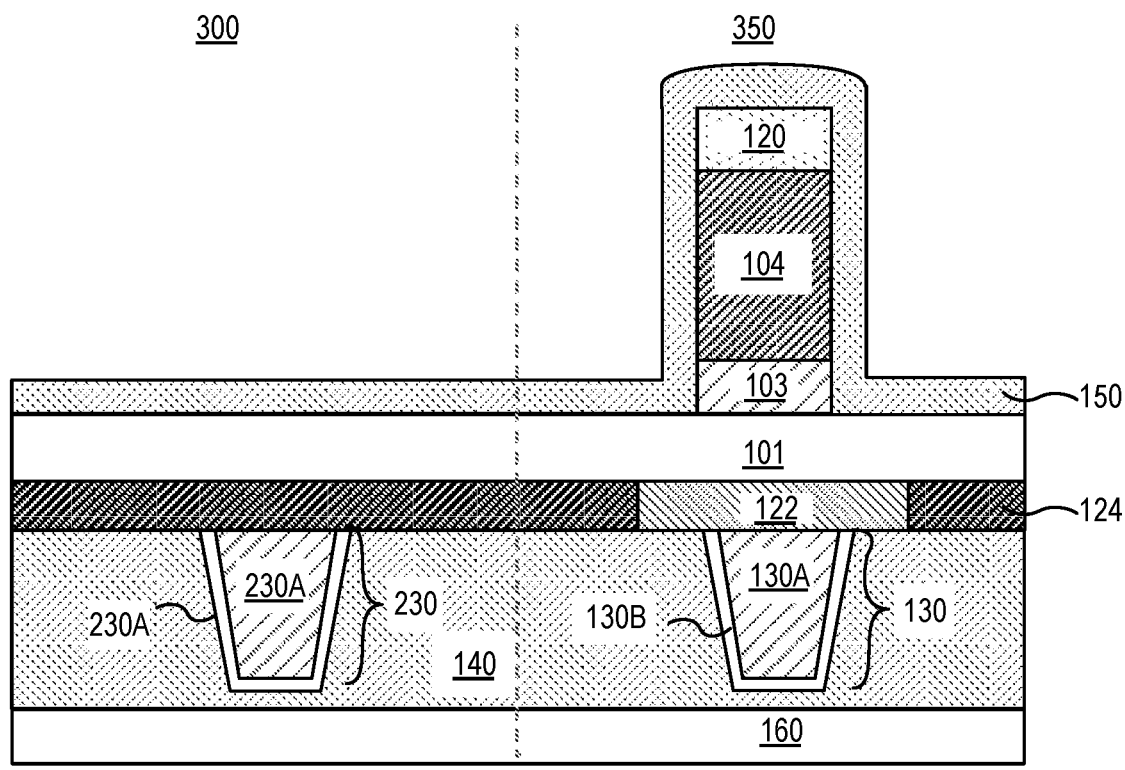
FIG. 3K illustrates the structure of FIG. 3J following the formation of an encapsulation layer over the MTJ and on the first conductive layer.
Figure 3L:
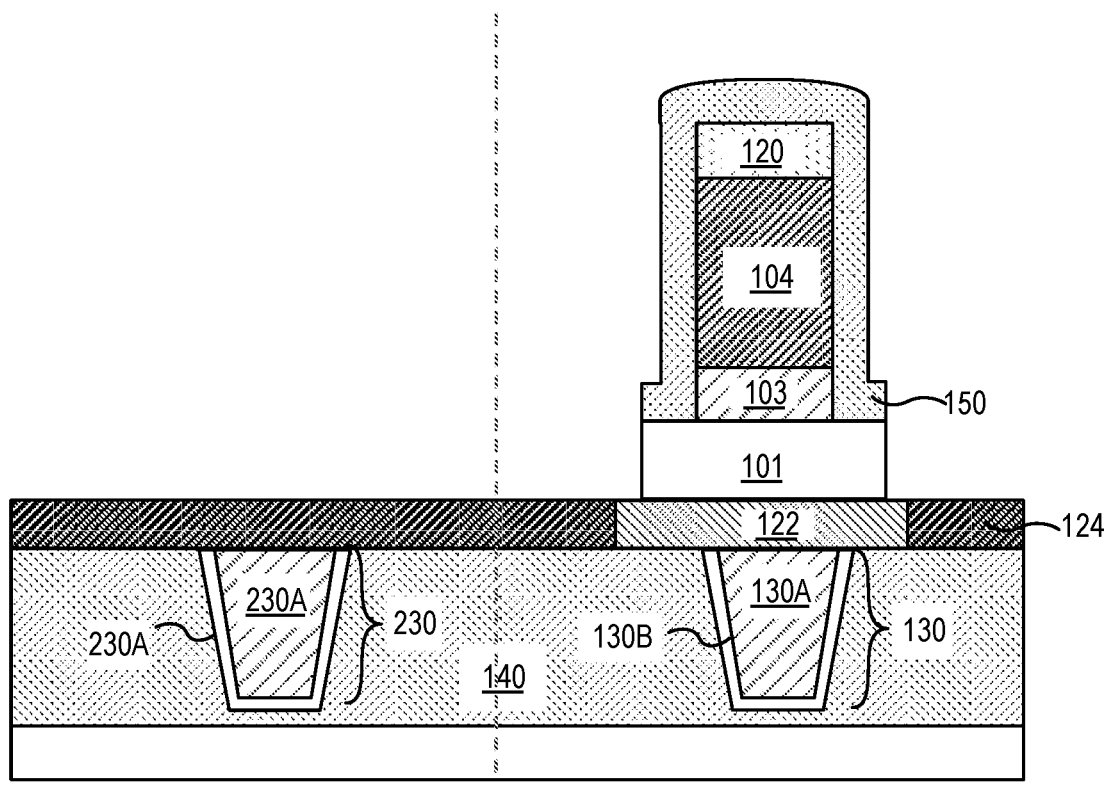
FIG. 3L illustrates the structure of FIG. 3K following the etching of the conductive layer into a patterned conductive layer and removal of sacrificial hard mask materials used to perform patterning.
Figure 3M:
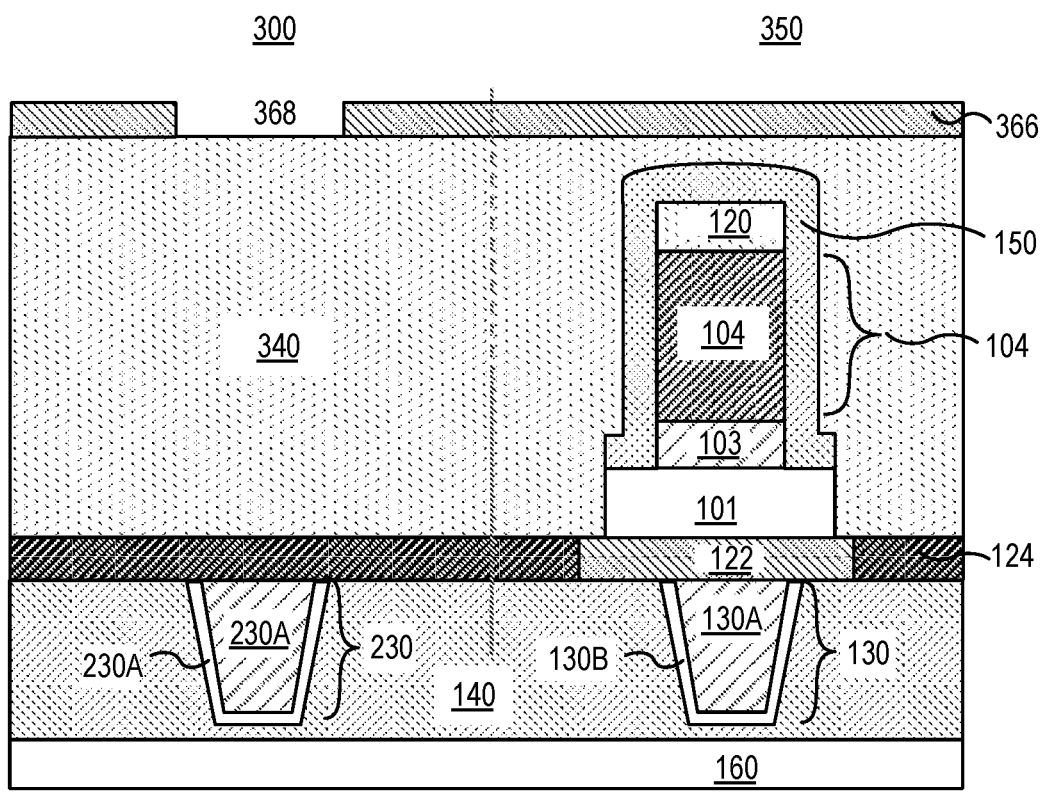
FIG. 3M illustrates the structure of FIG. 3L following the deposition of a dielectric material on the etch stop layer, followed by the formation of a mask.
Figure 3N:
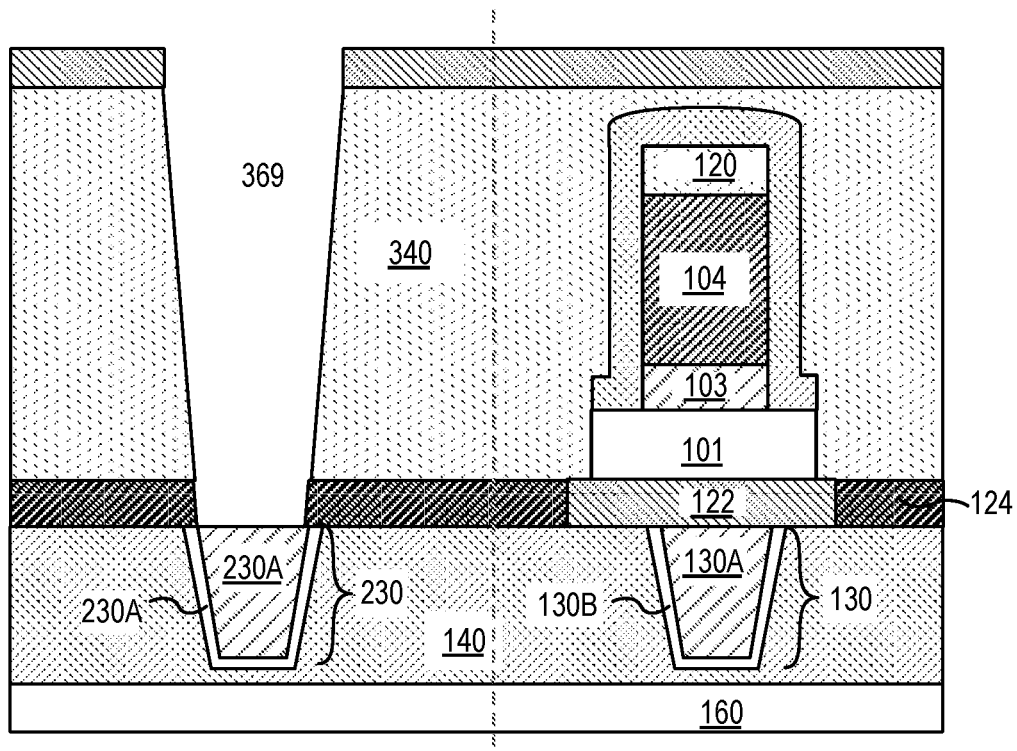
FIG. 3N illustrates the structure of FIG. 3M following the process of etching the dielectric material to form an opening in the dielectric material in the second region over the second conductive interconnect.
Figure 3O:
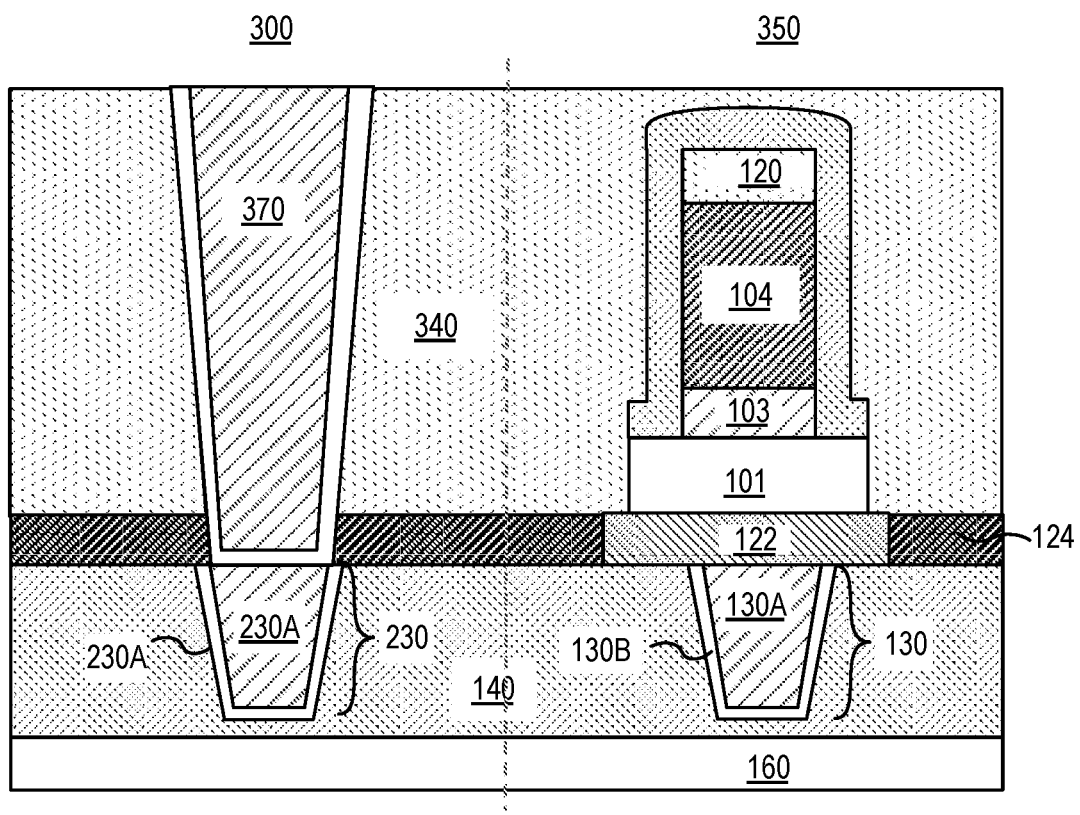
FIG. 3O illustrates the structure of FIG. 3N following the process of forming a third conductive interconnect in the opening in the dielectric material in the second region.

FIGS. 3A-3O illustrate cross-sectional views representing various operations in a method of fabricating a memory device in a first region 350 and a conductive interconnect adjacent to the memory device in a second region 300.

FIG. 3A illustrates a conductive interconnect 130 surrounded by a dielectric material 140 formed above a substrate 160 in a memory region 350, and a conductive interconnect 230 in a second region 300. FIG. 3A further illustrates an etch stop layer 124 above the conductive interconnect 130, 230 and above the dielectric material 140, extending continuously between the memory region and the second region. In an embodiment, the second region may be a region where integrated circuit components such as transistors may be fabricated. In some embodiments, the conductive interconnect 130 and 230 are formed in a dielectric material 140, that extends across both regions 300 and 350, by a damascene or a dual damascene process. In an embodiment, the conductive interconnects 130, 230 include a barrier layer 130A, 230A, respectively and a fill metal 130B, 230B. In some examples, the barrier layers 130A, 230A include a material such as tantalum nitride or ruthenium. In some examples, the fill metal 130B and 230B, include a material such as copper or tungsten. In other examples, the conductive interconnects 130 and 230 are fabricated using a subtractive etch process when materials other than copper are utilized. In an embodiment, the dielectric layer 140 includes a material such as but not limited to silicon dioxide, silicon nitride, silicon carbide, or carbon doped silicon oxide. The dielectric layer 140 may have an uppermost surface that is substantially co-planar with an uppermost surface of the conductive interconnects 130 and 230, as illustrated. In some embodiments, conductive interconnects 130 and 230 are each electrically connected to a separate circuit element such as a transistor (not shown).

FIG. 3B illustrates a cross-sectional view of the structure in FIG. 3A following the formation of an opening in the etch stop layer 124 over the conductive interconnect 130 in the memory region 350. In an embodiment, a mask (not shown) is formed above the etch stop layer 124. The mask may be lithographically patterned. In an embodiment, the etch stop layer 124 is patterned using the mask to form an opening 302. As an example of the patterning process, the etch stop layer 124 may be etched by a plasma etch process selectively to the conductive interconnect 130 and the dielectric material 140. When the opening 302 has a width that is narrower than a width of the conductive interconnect 130 then the etch process does not expose the dielectric material 140. In the illustrative embodiment, the opening 302 has a width that is wider than the conductive interconnect 130. The opening 302 defines a width of a conductive cap to be formed in a subsequent operation. In some embodiments, it is advantageous to have an opening that is wider than a width of the conductive interconnect 130 so that a conductive cap to be subsequently formed may act as an etch stop during downstream processing operations.

FIG. 3C illustrates a cross-sectional view of the structure in FIG. 3B following the formation of conductive capping layer 306 in the opening 302. In some examples, the conductive capping layer 306 is deposited using a physical vapor deposition process or a plasma enhanced chemical vapor deposition (PECVD) process. In an embodiment, the conductive capping layer 306 is blanket deposited in the opening 302 on the conductive interconnect 130 and on portions of the dielectric material 140, as shown. Conductive capping layer 306 may include a material that is the same as or substantially the same as the material of the conductive cap 122.

FIG. 3D illustrates the structure of FIG. 3C following the planarization of the conductive capping layer 306 from above the etch stop layer 124 in the memory and in the second region. In an embodiment, planarization process includes a chemical mechanical polish process. In one example, the polish process removes the conductive capping layer 306 from above the etch stop layer 124 and leaves a portion of the conductive capping layer 306 in the opening 302 to form a conductive cap 122 above the conductive interconnect 130.

FIG. 3E illustrates the structure of FIG. 3D following the formation of a conductive layer 304 on the conductive cap 122 and on the etch stop layer 124. In an embodiment, the conductive layer 304 includes a material such as TiN having a multi-orientation cubic crystal lattice texture and a columnar grain structure. An enhanced cross-sectional view of the region inside dashed lines 303 illustrates the columnar grains 304A, 304B in the conductive layer 304 which includes a material such as TiN. The uppermost surfaces 304C and 304D, respectively, of each columnar grain 304A, 304B are not smooth or co-planar, as deposited. In some examples, the conductive layer 304 is deposited using a physical vapor deposition process or a plasma enhanced chemical vapor deposition (PECVD) process.

FIG. 3F illustrates the structure of FIG. 3E following the planarization of the conductive layer 304. In an embodiment, planarization process includes a chemical mechanical polish process. In one example, the polish process removes an uppermost portion of the conductive layer 304. In an embodiment, the conductive layer 304 includes TiN. In one such embodiment, an enhanced cross-sectional view of the region inside dashed lines 303 illustrates co-planar or substantially co-planar uppermost surfaces 304C and 304D of the columnar grains 304A, 304B, respectively after planarization. In some embodiments, the uppermost surface of the conductive layer 304 has a non-uniformity of less than 1 nm, after the planarization process. The uppermost surface of the conductive layer 304 may become oxidized due to presence of ambient oxygen 307, when removed from a vacuum environment after the planarization process.

FIG. 3G illustrates the structure of FIG. 3H following the formation of a conductive layer 305 on the planarized surface of the conductive layer 304. In an embodiment, the uppermost surface of the conductive layer 304 is exposed to a pre-deposition clean process to remove any oxidized portions of the conductive layer 304. In some embodiments, the oxidized portions of the conductive layer 304 remain. In the illustrative embodiment, the conductive layer 305 includes a material such a TaN. In one such embodiment, a TaN conductive layer 305 is deposited to a thickness between 1 nm and 5 nm to mask the unfavorable crystal texture of the underlying TiN layer. In an embodiment, the conductive layer 305 is exposed to a non-vacuum environment. In some such embodiments, the uppermost surface of the conductive layer 305 may have portions that become oxidized due to presence of ambient oxygen 309. In other embodiments, the uppermost portion of the conductive layer 305 may not become oxidized if MTJ material layer stack is deposited in-situ after formation of the conductive layer 305.

FIG. 3H illustrates the structure of FIG. 3G following the formation of a pMTJ material layer stack 360 over the substrate 160. In an embodiment, a MTJ material layer stack 360 includes various fixed magnetic layers, a tunnel barrier layer, and a free magnetic structure including one or more layers of free magnetic layers. in an embodiment, a MTJ material layer stack 360 also includes the various additional layers of magnetic and non-magnetic inserts that are commonly used at a variety of positions inside the MTJ material layer stack 360 for a multitude of purposes such as blocking diffusion, enhancing film crystallinity and texture, and coupling two magnetic layers together either ferromagnetically or antiferromagnetically.

FIG. 3I illustrates the structure of FIG. 3H following the formation of a mask 362 on the conductive layer 320 in the memory region 350. In some embodiments, the mask 362 is formed by a lithographic process. In other embodiments, the mask 362 includes a dielectric material that has been patterned. The mask 362 defines a size of an MTJ that will subsequently be formed.

FIG. 3J illustrates the structure of FIG. 3I following the patterning and etching of the MTJ material layer stack 360. In an embodiment, the patterning process first includes etching the conductive layer 320 by a plasma etch process to form a top electrode 120.

In an embodiment, the plasma etch process is then continued to pattern the remaining layers of the MTJ material layer stack 360 to form a MTJ 104. In one embodiment, the plasma etch process etches the various layers in the MTJ material layer stack 360 to form a free magnet 108, a tunnel barrier 110, and a fixed magnet 112. The plasma etch process is then utilized to etch the conductive layer 305 into a conductive layer 103 having a width that is substantially the same as a width of the MTJ 104, $W_{MTJ}$. Forming the conductive layer 103 exposes the conductive layer 304. In the illustrative embodiment, the conductive layer 304 is utilized as an etch stop layer. In one embodiment, the MTJ material layer stack 360 and the conductive layer 305 are completely removed from the second region 300. In some embodiments, depending on the etch parameters, the MTJ 104 may have sidewalls that are tapered during the etching process, as indicated by the dashed lines 325.

FIG. 3K illustrates the structure of FIG. 3J following the formation of an encapsulation layer 150. In an embodiment, the encapsulation layer 150 is blanket deposited on the conductive layer 304, on sidewalls of the MTJ 104, and on sidewalls and on the uppermost surface of the top electrode 120. The encapsulation layer 150 is designed to protect the layers in the MTJ 104 during subsequent processing operations. In some embodiments, the encapsulated layer 150 may be conformally deposited. In other embodiments, the portions of the encapsulation layer 150 on the conductive layer 304 and on uppermost surface of the top electrode 120 have a greater thickness than portions on sidewalls of the MTJ 104 and on sidewalls of the top electrode 120. The encapsulation layer 150 is deposited to a thickness between 10 nm and 30 nm.

In some examples, the encapsulation layer 150 is deposited using a chemical vapor deposition (CVD) process or a plasma enhanced chemical vapor deposition (PECVD) process.

FIG. 3L illustrates the structure of FIG. 3K following the etching of the encapsulation layer 150 and etching of the conductive layer 304 to form a patterned conductive layer 101. In an embodiment, a sacrificial layer is deposited over the encapsulation layer 150 and a mask is formed on the sacrificial layer over the MTJ 104 in the memory region. In an embodiment, the sacrificial layer and portions of the encapsulation layer 150 are etched to form a patterned encapsulation layer 150. In the illustrative embodiment, the laterally extended portion of the patterned encapsulation layer 150 defines a width of the conductive layer 101. As shown, the conductive layer 101 is etched selectively with respect to the etch stop layer 124 in the logic region 300, and in portions of the memory region 350 not masked by the patterned encapsulation layer 150. When the conductive cap 122 is wider than a combined width of the MTJ 104, $W_{MTJ}$, and lowermost lateral portions of the patterned encapsulation layer 150, the conductive cap 122 acts as an etch stop and protects the underlying conductive interconnect 130. After the etching process, the sacrificial layer and the mask are removed.

FIG. 3M illustrates the structure of FIG. 3L following the deposition of a dielectric material 340 on the patterned encapsulation layer 150 and on the etch stop layer 124, followed by the formation of a mask 366. In the illustrative embodiment, the dielectric material 340 is also deposited on exposed portions of the conductive cap 122. The dielectric material 340 includes a material that is the same or substantially the same as the dielectric material 140 and may be blanket deposited. In some examples, the dielectric material 340 is planarized after deposition to facilitate downstream lithography process. In one embodiments, the planarization process does not expose the patterned encapsulation layer 150 above the MTJ 104. The mask 366 provides an opening 368, in the second region 300. In the illustrative embodiment, the opening 368 in the mask 366 is substantially above the conductive interconnect 230.

FIG. 3N illustrates the structure of FIG. 3M following the process of etching the dielectric material 340 to form an opening 369 in the dielectric material 340 in the second region. In an embodiment, etching process utilizes a plasma etch process. The plasma etch process first removes the dielectric material 340 and subsequently etches exposed portions of the etch stop layer 124 to form the opening 369. In the illustrative embodiment, the plasma etch exposes uppermost portion of the underlying conductive interconnect 230.

FIG. 3O illustrates the structure of FIG. 3N following the process of forming a conductive interconnect 370 in the opening 369 in the dielectric material 340 in the second region. As shown portions of the conductive interconnect 370 is adjacent to the etch stop layer 124 in the second region. The conductive interconnect 370 is also formed on portions of the conductive interconnect 230, as shown. In an embodiment, the process of forming conductive interconnect 370 is the same or substantially the same as the process for forming conductive interconnect 230.

Figure 4:
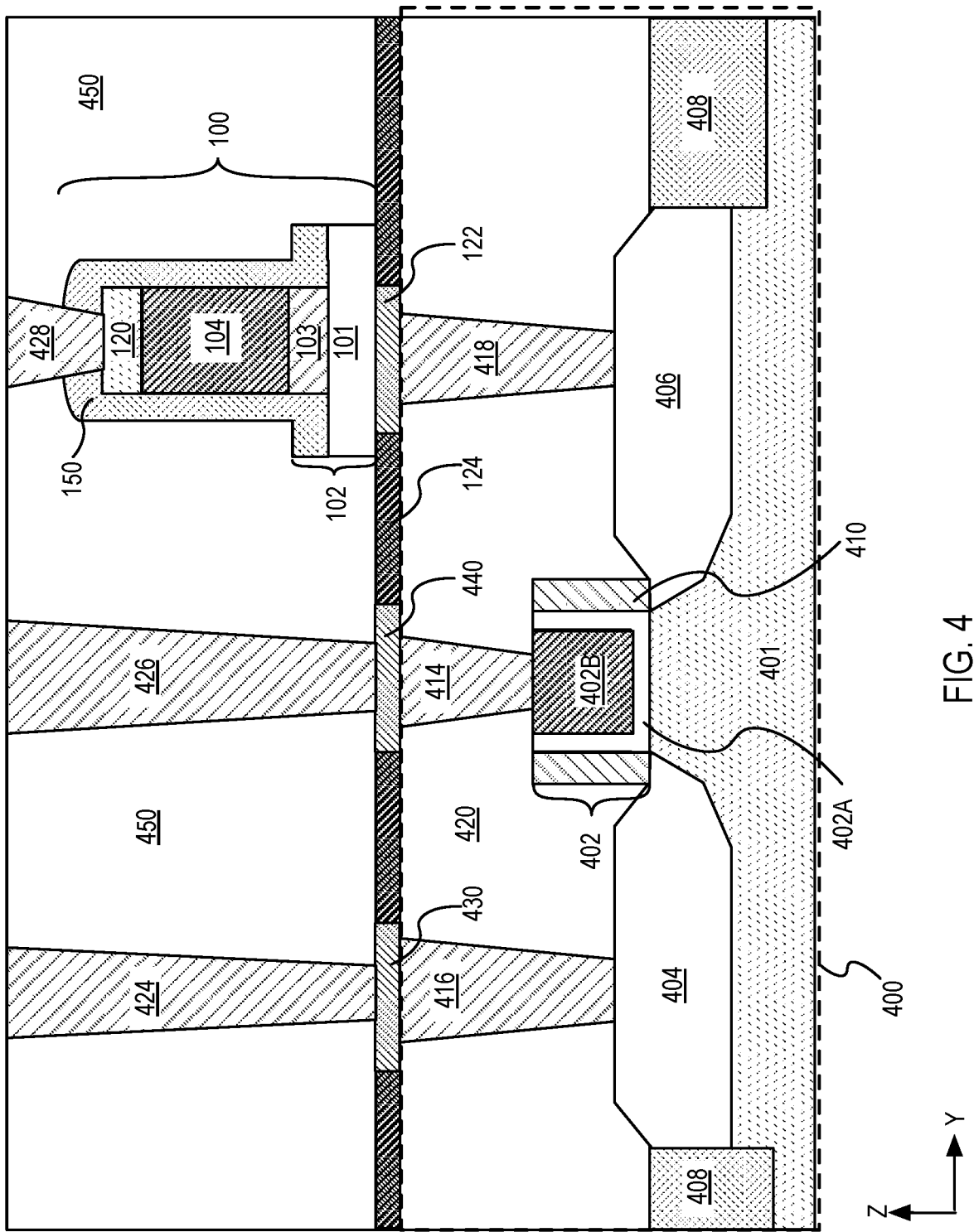
FIG. 4 illustrates a memory device coupled to a transistor.

FIG. 4 illustrates a memory device 100 coupled to a transistor 400. In an embodiment, the memory device 100 includes a MTJ 104 on an electrode 102, described in association with FIGS. 1A and 2. The memory device 100 may include one or more features of the memory device 100 described above in embodiments, associated with FIGS. 1A-1D and in FIG. 2.

Figure 6:
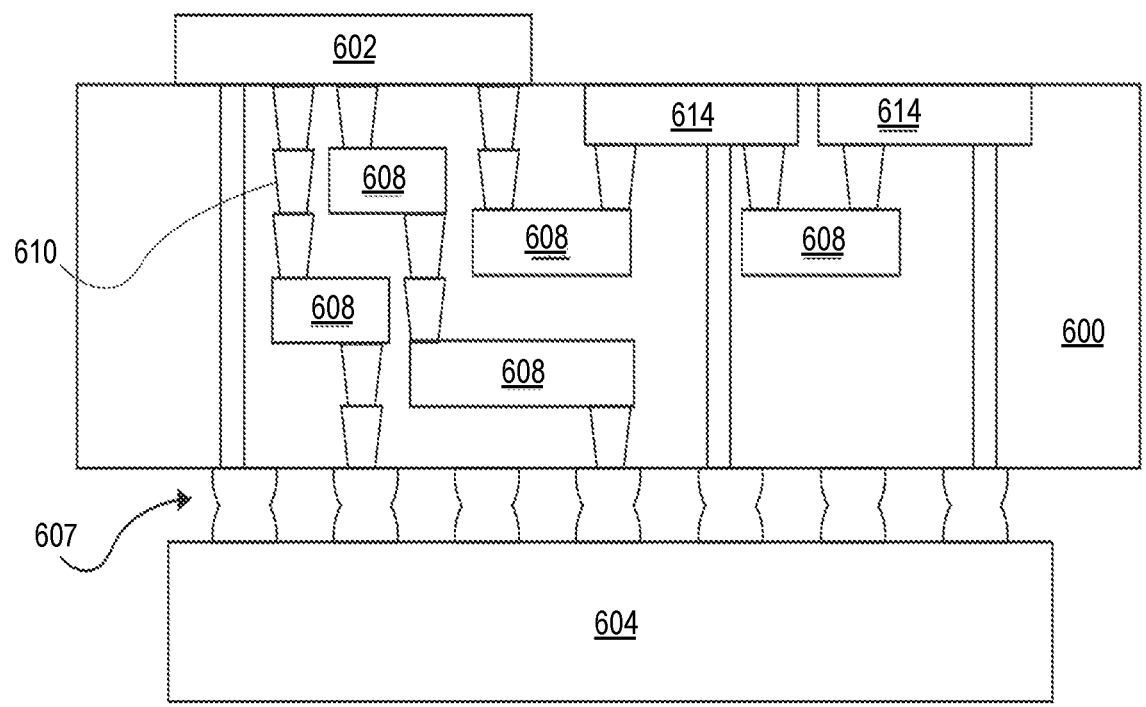
FIG. 6 illustrates an integrated circuit (IC) structure that includes one or more embodiments of the present disclosure.

In an embodiment, the transistor 400 has a source region 404, a drain region 406 and a gate 402. The transistor 400 further includes a gate contact 414 above and electrically coupled to the gate 402, a source contact 416 above and electrically coupled to the source region 404, and a drain contact 418 above and electrically coupled to the drain region 406 as is illustrated in FIG. 6. In the illustrative embodiment, the memory device 100 includes a first electrode 102 having a first conductive layer 101 that includes titanium and nitrogen. The electrode 102 also has a second conductive layer 103 on the conductive layer 101 that includes tantalum and nitrogen. The memory device 100 further includes a magnetic tunnel junction (MTJ) 104 on the electrode 102, where the MTJ 104 includes a free magnet 108, a fixed magnet 112 and a tunnel barrier 110 between the free magnet 108 and the fixed magnet 112. The memory device 100 further includes a second electrode, such as a top electrode 120 on MTJ 104.

In the illustrative embodiment, the memory device 100 further includes an encapsulation layer 150 on portions of the conductive layer 101. The encapsulation layer is also adjacent to the sidewalls of the MTJ 104 and adjacent to sidewalls of the top electrode 120. As illustrated, a portion of the encapsulation layer 150 is on the top electrode 120.

The memory device 100, is on a conductive cap 122 below the conductive layer 101. The memory device 100 is electrically coupled with the drain contact 418 of transistor 400 through the conductive cap 122. A MTJ contact 428 is on and electrically coupled with the top electrode 120 of the MTJ 104.

In an embodiment, the underlying substrate 401 represents a surface used to manufacture integrated circuits. Suitable substrate 401 includes a material such as single crystal silicon, polycrystalline silicon and silicon on insulator (SOI), as well as substrates formed of other semiconductor materials. In some embodiments, the substrate 401 is the same as or substantially the same as the substrate 126. The substrate 401 may also include semiconductor materials, metals, dielectrics, dopants, and other materials commonly found in semiconductor substrates.

In an embodiment, the access transistor 400 associated with substrate 401 are metal-oxide-semiconductor field-effect transistors (MOSFET or simply MOS transistors), fabricated on the substrate 401. In various implementations of the invention, the access transistor 400 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, the access transistor 400 of substrate 401 includes a gate 402. In some embodiments, gate 402 includes at least two layers, a gate dielectric layer 402A and a gate electrode 402B. The gate dielectric layer 402A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 402A to improve its quality when a high-k material is used.

The gate electrode 402B of the access transistor 400 of substrate 401 is formed on the gate dielectric layer 402A and may consist of at least one P-type work function metal or N-type work function metal, depending on whether the transistor is to be a PMOS or an NMOS transistor. In some implementations, the gate electrode 402B may consist of a stack of two or more metal layers, where one or more metal layers are work function metal layers and at least one metal layer is a conductive fill layer.

For a PMOS transistor, metals that may be used for the gate electrode 402B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 402B may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode 402B may consist of one or more U-shaped metal layers formed atop one or more planar, non-U-shaped layers.

In some implementations of the invention, a pair of sidewall spacers 410 are on opposing sides of the gate 402 that bracket the gate stack. The sidewall spacers 410 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As is well known in the art, source region 404 and drain region 406 are formed within the substrate adjacent to the gate stack of each MOS transistor. The source region 404 and drain region 406 are generally formed using either an implantation/diffusion process or an etching/deposition process. In the former process, dopants such as boron, aluminum, antimony, phosphorous, or arsenic may be ion-implanted into the substrate to form the source region 404 and drain region 406. An annealing process that activates the dopants and causes them to diffuse further into the substrate typically follows the ion implantation process. In the latter process, the substrate 401 may first be etched to form recesses at the locations of the source and drain regions. An epitaxial deposition process may then be carried out to fill the recesses with material that is used to fabricate the source region 404 and drain region 406. In some implementations, the source region 404 and drain region 406 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 404 and drain region 406 may be formed using one or more alternate semiconductor materials such as germanium or a group III-V material or alloy. And in further embodiments, one or more layers of metal and/or metal alloys may be used to form the source region 404 and drain region 406. In the illustrative embodiment, an isolation 408 is adjacent to the source region 404, drain region 406 and portions of the substrate 401.

In an embodiment, a dielectric layer 420 is adjacent to the source contact 416, the drain contact 418 and the gate contact 414. As illustrated, an etch stop layer 124 is on the dielectric layer 420 and extends laterally above the gate contact 414, drain contact 418 and the source contact 416 of transistor 400.

In the illustrative embodiment, a source metallization structure 424 is coupled with the source contact 416 and a gate metallization structure 426 is coupled with the gate contact 414. In an embodiment, the transistor further includes a conductive cap 430 between the source metallization structure 424 and the source contact 416, and a conductive cap 440 between the gate metallization structure 426 is coupled with the gate contact 414.

In the illustrated embodiment, a dielectric layer 450 is adjacent to the gate metallization structure 426, source metallization structure 424, and memory device 100.

In an embodiment, the conductive cap 430 and 440 include a material that is the same or substantially the same as the material of the conductive cap 122.

In an embodiment, the source contact 416, the drain contact 418 and gate contact 414 each include a multi-layer stack. In an embodiment, the multi-layer stack includes two or more distinct layers of metal such as a layer of Ti, Ru or Al and a conductive cap on the layer of metal. The conductive cap may include a material such as W or Cu.

The isolation 408 and dielectric layers 420 and 450 may include any material that has sufficient dielectric strength to provide electrical isolation such as, but not, limited silicon dioxide, silicon nitride, silicon oxynitride, carbon doped nitride and carbon doped oxide.

Figure 5:
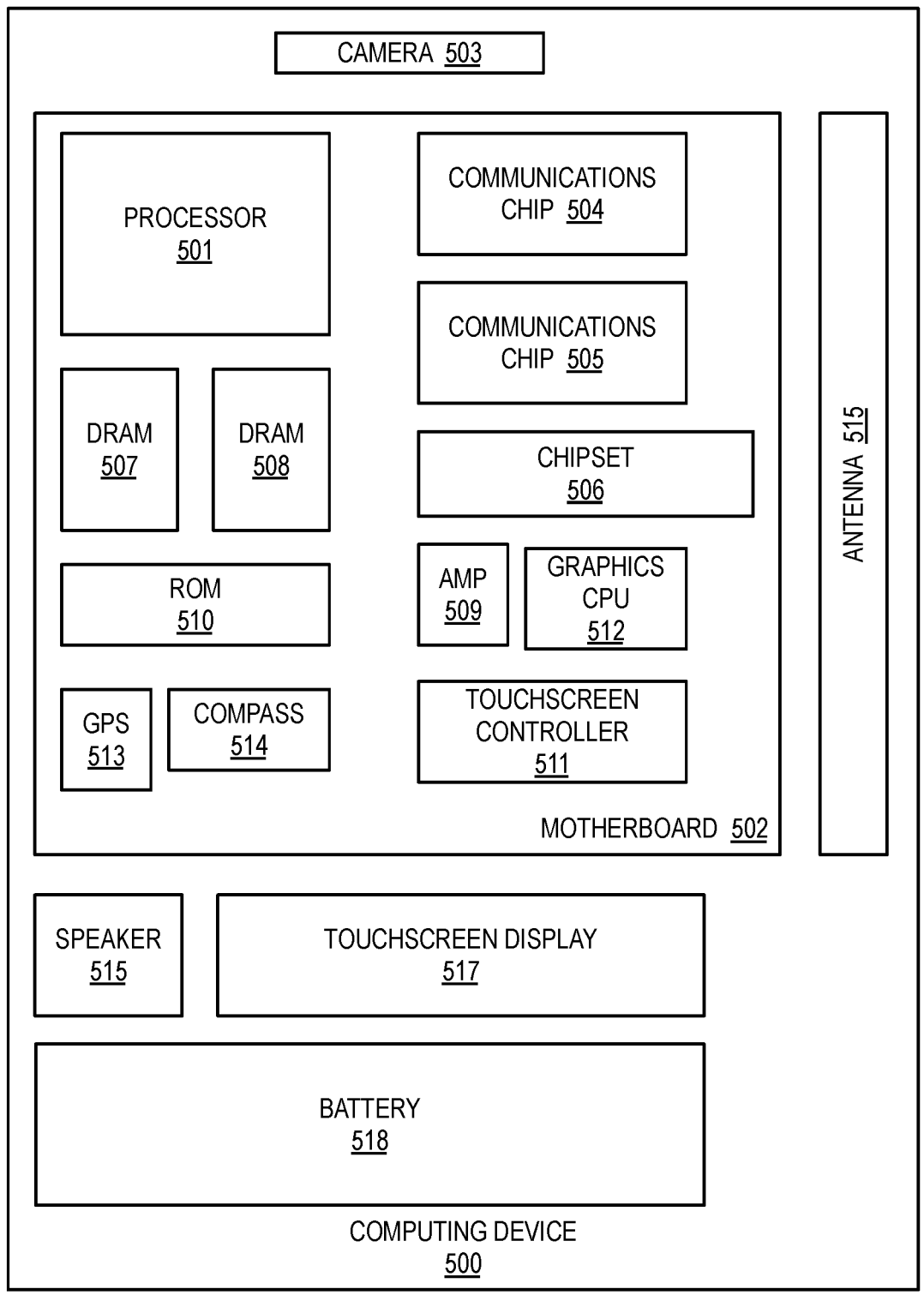
FIG. 5 illustrates a computing device in accordance with embodiments of the present disclosure.

FIG. 5 illustrates a computing device 500 in accordance with embodiments of the present disclosure. As shown, computing device 500 houses a motherboard 502. Motherboard 502 may include a number of components, including but not limited to a processor 501 and at least one communications chip 505. Processor 501 is physically and electrically coupled to the motherboard 502. In some implementations, communications chip 505 is also physically and electrically coupled to motherboard 502. In further implementations, communications chip 505 is part of processor 501.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset 506, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 505 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 505 may implement any of a number of wireless standards or protocols, including but not limited to Wi-Fi (IEEE 802.6 family), WiMAX (IEEE 802.6 family), IEEE 802.10, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communications chips 504 and 505. For instance, a first communications chip 505 may be dedicated to shorter range wireless communications such as Wi-Fi and Bluetooth and a second communications chip 504 may be dedicated to longer range wireless communications such as GPS, EDGE, GPRS, CDMA, WiMAX, LTE, Ev-DO, and others.

Processor 501 of the computing device 500 includes an integrated circuit die packaged within processor 501. In some embodiments, the integrated circuit die of processor 501 includes one or more memory devices, such as a memory device 100, including a MTJ 104 on an electrode 102, in accordance with embodiments of the present disclosure. The term "processor" may refer to any device or portion of a device that processes electronic data from registers and/or memory to transform that electronic data into other electronic data that may be stored in registers and/or memory.

Communications chip 505 also includes an integrated circuit die packaged within communications chip 505. In another embodiment, the integrated circuit die of communications chips 504, 505 include a memory array with memory cells including at least one memory device such as a memory device 100 including a MTJ 104 on an electrode 102.

In various examples, one or more communications chips 504, 505 may also be physically and/or electrically coupled to the motherboard 502. In further implementations, communications chips 504 may be part of processor 501. Depending on its applications, computing device 500 may include other components that may or may not be physically and electrically coupled to motherboard 502. These other components may include, but are not limited to, volatile memory (e.g., DRAM) 507, 508, non-memory (e.g., ROM) 510, a graphics CPU 512, flash memory, global positioning system (GPS) device 513, compass 514, a chipset 506, an antenna 515, a power amplifier 509, a touchscreen controller 511, a touchscreen display 517, a speaker 515, a camera 503, and a battery 518, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 500 and discussed above may contain a stand-alone integrated circuit memory die that includes one or more arrays of memory cells including one or more memory devices, such as a memory device 100, including a MTJ 104 on an electrode 102, built in accordance with embodiments of the present disclosure.

In various implementations, the computing device 500 may be a laptop, a netbook, a notebook, an ultrabook, a smartphone, a tablet, an internet of things (IOT) device, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

FIG. 6 illustrates an integrated circuit (IC) structure 600 that includes one or more embodiments of the disclosure. The integrated circuit (IC) structure 600 is an intervening substrate used to bridge a first substrate 602 to a second substrate 604. The first substrate 602 may be, for instance, an integrated circuit die. The second substrate 604 may be, for instance, a memory module, a computer mother, or another integrated circuit die. Generally, the purpose of an integrated circuit (IC) structure 600 is to spread a connection to a wider pitch or to reroute a connection to a different connection. For example, an integrated circuit (IC) structure 600 may couple an integrated circuit die to a ball grid array (BGA) 607 that can subsequently be coupled to the second substrate 604. In some embodiments, the first and second substrates 602/604 are attached to opposing sides of the integrated circuit (IC) structure 600. In other embodiments, the first and second substrates 602/604 are attached to the same side of the integrated circuit (IC) structure 600. And in further embodiments, three or more substrates are interconnected by way of the integrated circuit (IC) structure 600.

The integrated circuit (IC) structure 600 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 608 and vias 610, including but not limited to through-silicon vias (TSVs) 610. The integrated circuit (IC) structure 600 may further include embedded devices 614, including both passive and active devices. Such devices include, but are not limited to, capacitors, decoupling capacitors, resistors, inductors, fuses, diodes, transformers, device structure including transistors described above, such as transistors 400 coupled with a with one at least one memory device such as the memory device 100 which includes the MTJ 104 on the electrode 102, where the electrode includes a conductive layer 101 and a conductive layer 103 on the conductive layer 101, and further where at least a portion of the conductive layer 101 proximal to the conductive layer 103 includes oxygen, for example. The integrated circuit (IC) structure 600 may further include embedded devices 614 such as one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 600. In accordance with embodiments of the present disclosure, apparatuses or processes disclosed herein may be used in the fabrication of integrated circuit (IC) structure 600.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of a memory device such as the memory device 100. The memory device 100 may be used in an embedded non-volatile memory application.

Thus, embodiments of the present disclosure include magnetic memory devices with layered electrodes and methods to form the same.

Specific embodiments are described herein with respect to non-volatile memory devices that include a magnetic tunnel junction. It is to be appreciated that embodiments described herein may also be applicable to other non-volatile memory devices. Such non-volatile memory devices may include, but are not limited to, magnetic random-access memory (MRAM) devices, spin torque transfer memory (STTM) devices such as in-plane STTM or perpendicular STTM devices.

In a first example, a memory device includes a first electrode including a first conductive layer that includes titanium and nitrogen, and a second conductive layer on the first conductive layer, where the second conductive layer includes tantalum and nitrogen. The memory device further includes a second electrode and a magnetic tunnel junction (MTJ) between the first and second electrodes where the MTJ includes a fixed magnet, a free magnet and a tunnel barrier between the fixed and the free magnet.

In second examples, for any of first examples, at least a portion of the first conductive layer proximal to an interface with the second conductive layer further includes oxygen.

In third examples, for any of the first through second examples, at least a portion of the second conductive layer proximal to an interface with a layer of the MTJ further includes oxygen.

In fourth examples, for any of the first through third examples, the first conductive layer has a multi-orientation cubic crystal lattice texture and a columnar grain structure.

In fifth examples, for any of the fourth example, wherein a plurality of columnar grain structures across a width of the first conductive layer have a substantially co-planar uppermost surface.

In sixth examples, for any of the first through fifth examples, the first conductive layer has a first sidewall and an opposing second sidewall that is separated by a first width, the second conductive layer has a third sidewall and an opposing fourth sidewall that is separated by a second width, wherein the first sidewall extends laterally beyond the third sidewall and the second sidewall extends laterally beyond the fourth sidewall.

In seventh examples, for any of the first through sixth examples, the first conductive layer has a thickness between 10 nm and 30 nm and the second conductive layer has a thickness between 1 nm and 5 nm.

In eighth examples, for any of the first through seventh examples, the second conductive layer is on a first portion of the first conductive layer and the memory device further includes an encapsulation layer on a second portion of the first conductive layer, adjacent to a sidewall of the second conductive layer and adjacent to a sidewall of the MTJ.

In ninth examples, for any of the first through eighth examples, the encapsulation layer is on the second electrode an over an interface between the second electrode and the MTJ.

In tenth examples, for any of the first through ninth examples, the memory device further includes a third conductive layer below the first conductive layer, where the third conductive layer has a width greater than the first width.

In eleventh examples, an integrated circuit structure includes a first region including a transistor, a first conductive interconnect coupled with a terminal of the transistor, an etch stop layer above the first conductive interconnect. The integrated circuit structure further includes a second region adjacent to the first region, where the second region, includes a second conductive interconnect, the etch stop layer above the second conductive interconnect, a conductive cap on the second conductive interconnect adjacent to the etch stop layer, and a first electrode on the conductive cap, where the electrode structure includes a first conductive layer includes titanium and nitrogen, a second conductive layer on the first conductive layer, where the second conductive layer includes tantalum and nitrogen. The integrated circuit structure further includes a second electrode and a memory device between the first and second electrode. The memory device includes a first electrode including a first conductive layer that includes titanium and nitrogen, and a second conductive layer on the first conductive layer, where the second conductive layer includes tantalum and nitrogen.

The memory device further includes a second electrode and a magnetic tunnel junction (MTJ) between the first and second electrodes where the MTJ includes a fixed magnet, a free magnet and a tunnel barrier between the fixed and the free magnet.

In twelfth examples, for any of the eleventh example, the etch stop layer is continuous between the first and the second region.

In thirteenth examples, for any of the eleventh through thirteenth examples, the integrated circuit structure further includes a third conductive interconnect on the first conductive interconnect, wherein a portion of the third conductive is adjacent to the etch stop layer. In a fourteenth example, for any of the eleventh through thirteenth examples, the first conductive layer has a multi-orientation cubic crystal lattice texture and a columnar grain structure and wherein a plurality of the columnar grain structures has a substantially co-planar uppermost surface.

In a fifteenth example, a method of fabricating a magnetic tunnel junction (MTJ) device includes forming a first conductive layer including titanium and nitrogen above a first conductive interconnect structure, forming a second conductive layer including tantalum and nitrogen on the first conductive layer, forming a material layer stack for the MTJ device on the second conductive layer, etching the material layer stack to form an MTJ device, etching the second conductive layer, where the etching does not clear the first conductive layer and etching the first conductive layer.

In sixteenth examples, for any of the fifteenth examples, forming the first conductive layer includes planarizing an upper portion of the first conductive layer and wherein forming the second conductive layer introduces oxygen proximal to an interface between the first conductive layer and the second conductive layer.

In seventeenth examples, for any of the fifteenth through sixteenth examples, after etching the second conductive layer the method further includes forming an encapsulation layer on an uppermost surface and on a sidewall of the MTJ device, and on the first conductive layer.

In eighteenth examples, for any of the seventeenth examples, the method of fabricating a magnetic tunnel junction (MTJ) device further includes forming a mask over a portion of the encapsulation layer on the uppermost surface and on the sidewall of the MTJ device, etching a portion of the encapsulation layer and using the encapsulation as a mask and etching the first conductive layer.

In nineteenth examples, for any of the fifteenth through sixteenth examples, the etching removes the encapsulation and the first conductive layer over a second conductive interconnect structure.

What is claimed is:

1. A memory device, comprising:
   a first electrode comprising:
      a first conductive layer comprising titanium and nitrogen; and
      a second conductive layer on the first conductive layer, wherein the second conductive layer comprises tantalum and nitrogen, and wherein the first conductive layer has a thickness between 10 nm and 30 nm and the second conductive layer has a thickness between 1 nm and 5 nm;
   a second electrode; and
   a magnetic tunnel junction (MTJ) between the first and second electrodes, the MTJ comprising:
      a fixed magnet;
      a free magnet; and
      a tunnel barrier between the fixed and the free magnet.

2. The memory device of claim 1, wherein at least a portion of the first conductive layer proximal to an interface with the second conductive layer further comprises oxygen.

3. The memory device of claim 1, wherein at least a portion of the second conductive layer proximal to an interface with a layer of the MTJ further comprises oxygen.

4. The memory device of claim 1, wherein the first conductive layer has a multi-orientation cubic crystal lattice texture and a columnar grain structure.

5. The memory device of claim 1, wherein the first conductive layer has a first sidewall and an opposing second sidewall, the second conductive layer has a third sidewall and an opposing fourth sidewall, and the first sidewall extends laterally beyond the third sidewall and the second sidewall extends laterally beyond the fourth sidewall.

6. The memory device of claim 1, further comprising a third conductive layer below the first conductive layer, wherein the third conductive layer has a width greater than a width of the first conductive layer.

7. The memory device of claim 1, wherein the second conductive layer is on a first portion of the first conductive layer and the memory device further comprises an encapsulation layer on a second portion of the first conductive layer, adjacent to a sidewall of the second conductive layer and adjacent to a sidewall of the MTJ.

8. A memory device, comprising:
a first electrode comprising:
a first conductive layer comprising titanium and nitrogen; and
a second conductive layer on the first conductive layer, wherein the second conductive layer comprises tantalum and nitrogen, and wherein the first conductive layer has a multi-orientation cubic crystal lattice texture and a columnar grain structure;
a second electrode; and
a magnetic tunnel junction (MTJ) between the first and second electrodes, the MTJ comprising:
a fixed magnet;
a free magnet; and
a tunnel barrier between the fixed and the free magnet.

9. The memory device of claim 8, wherein at least a portion of the first conductive layer proximal to an interface with the second conductive layer further comprises oxygen.

10. The memory device of claim 8, wherein a portion of the second conductive layer proximal to an interface with a layer of the MTJ further comprises oxygen.

11. The memory device of claim 8, wherein a plurality of columnar grain structures across a width of the first conductive layer have substantially co-planar uppermost surfaces.

12. The memory device of claim 8, wherein the first conductive layer has a first sidewall and an opposing second sidewall, the second conductive layer has a third sidewall and an opposing fourth sidewall, and the first sidewall extends laterally beyond the third sidewall and the second sidewall extends laterally beyond the fourth sidewall.

13. The memory device of claim 8, wherein the second conductive layer is on a first portion of the first conductive layer and the memory device further comprises an encapsulation layer on a second portion of the first conductive layer, adjacent to a sidewall of the second conductive layer and adjacent to a sidewall of the MTJ.

14. A memory device, comprising:
a first electrode comprising:
a first conductive layer comprising titanium and nitrogen; and
a second conductive layer on the first conductive layer, wherein the second conductive layer comprises tantalum and nitrogen, and wherein the first conductive layer has a first sidewall and an opposing second sidewall, the second conductive layer has a third sidewall and an opposing fourth sidewall, and the first sidewall extends laterally beyond the third sidewall and the second sidewall extends laterally beyond the fourth sidewall;
a second electrode; and
a magnetic tunnel junction (MTJ) between the first and second electrodes, the MTJ comprising:
a fixed magnet;
a free magnet; and
a tunnel barrier between the fixed and the free magnet.

15. The memory device of claim 14, wherein at least a portion of the first conductive layer proximal to an interface with the second conductive layer further comprises oxygen.

16. The memory device of claim 14, wherein a portion of the second conductive layer proximal to an interface with a layer of the MTJ further comprises oxygen.

17. The memory device of claim 14, wherein the second conductive layer is on a first portion of the first conductive layer and the memory device further comprises an encapsulation layer on a second portion of the first conductive layer and adjacent to the third sidewall.

18. The memory device of claim 17, wherein the encapsulation layer is on the second electrode and over an interface between the second electrode and the MTJ.

19. A memory device, comprising:
a first electrode comprising:
a first conductive layer comprising titanium and nitrogen; and
a second conductive layer on the first conductive layer, wherein the second conductive layer comprises tantalum and nitrogen, and wherein at least a portion of the first conductive layer proximal to an interface with the second conductive layer or a portion of the second conductive layer proximal to an interface with a layer of the MTJ further comprises oxygen;
a second electrode; and
a magnetic tunnel junction (MTJ) between the first and second electrodes, the MTJ comprising:
a fixed magnet;
a free magnet; and
a tunnel barrier between the fixed and the free magnet.

20. The memory device of claim 19, wherein the first conductive layer comprises a plurality of columnar grain structures.

21. The memory device of claim 19, wherein the second conductive layer is on a first portion of the first conductive layer and the memory device further comprises an encapsulation layer on a second portion of the first conductive layer.

22. The memory device of claim 21, wherein the encapsulation layer is over the second electrode and an interface between the second electrode and the MTJ.

* * * * *